United States Patent
Anai et al.

(10) Patent No.: US 6,458,208 B1
(45) Date of Patent: Oct. 1, 2002

(54) FILM FORMING APPARATUS

(75) Inventors: Noriyuki Anai, Kumamoto-ken; Tsutae Omori, Yamanashi-ken; Masaaki Takizawa; Mitsuhiro Sakai, both of Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/643,941

(22) Filed: Aug. 23, 2000

Related U.S. Application Data

(63) Continuation of application No. 09/135,408, filed on Aug. 18, 1998, now Pat. No. 6,165,552.

(30) Foreign Application Priority Data

| Aug. 19, 1997 | (JP) | 9-238953 |
| Oct. 31, 1997 | (JP) | 9-314633 |
| Jan. 23, 1998 | (JP) | 10-026726 |

(51) Int. Cl.$^7$ ............................................. B05C 11/08
(52) U.S. Cl. .................... 118/52; 118/313; 118/315; 118/316; 118/320; 118/321; 427/240; 427/425
(58) Field of Search .................... 118/52, 320, 321, 118/313, 315, 316; 427/240, 425

(56) References Cited

U.S. PATENT DOCUMENTS

| 5,571,560 A | * 11/1996 | Lin | 118/52 |
| 5,626,913 A | * 5/1997 | Tomoeda et al. | 427/240 |
| 5,658,615 A | * 8/1997 | Hasebe et al. | 427/240 |
| 5,695,817 A | * 12/1997 | Tateyama et al. | 427/240 |
| 5,720,814 A | * 2/1998 | Takagi et al. | 118/52 |
| 5,919,520 A | * 7/1999 | Tateyama et al. | 427/240 |
| 5,962,070 A | * 10/1999 | Mitsuhashi et al. | 118/52 |
| 5,972,426 A | * 10/1999 | Kutsuzawa et al. | 427/240 |
| 6,162,507 A | * 12/2000 | Hayes et al. | 427/240 |
| 6,234,692 B1 | * 5/2001 | Shin | 427/240 |
| 6,241,403 B1 | * 6/2001 | Sakamoto et al. | 427/240 |

* cited by examiner

Primary Examiner—Shrive P. Beck
Assistant Examiner—Kirsten A. Crockford
(74) Attorney, Agent, or Firm—Rader, Fishman & Grauer PLLC

(57) ABSTRACT

A film forming apparatus comprising: a spin chuck; a cup; a lid; a first circular/tubular nozzle for supplying a resist solution to a first portion corresponding to the rotation center portion of a rectangular substrate; a plurality of second circular/tubular nozzles that supply the resist solution to a plurality of second portions of the rectangular substrate to which supply of the resist solution by centrifugal force is difficult, the distances between the rotation center portion and each of the second portions being greater than a half of a shorter side of the rectangular substrate; a rectangular nozzle holder that holds the first nozzle and the second nozzles; a mechanism that positions the nozzle holder; a controller that controls an amount of the resist solution from the first and second nozzles, attaches the lid to the cup, and rotates the substrate with the spin chuck; a resist solution tank; a supply tube provided between the resist solution tank and the first and second nozzles; a bellows pump for supplying the resist solution to the first and second nozzles; and an air operation valve for passing or stopping the resist solution in the supply tube.

5 Claims, 30 Drawing Sheets

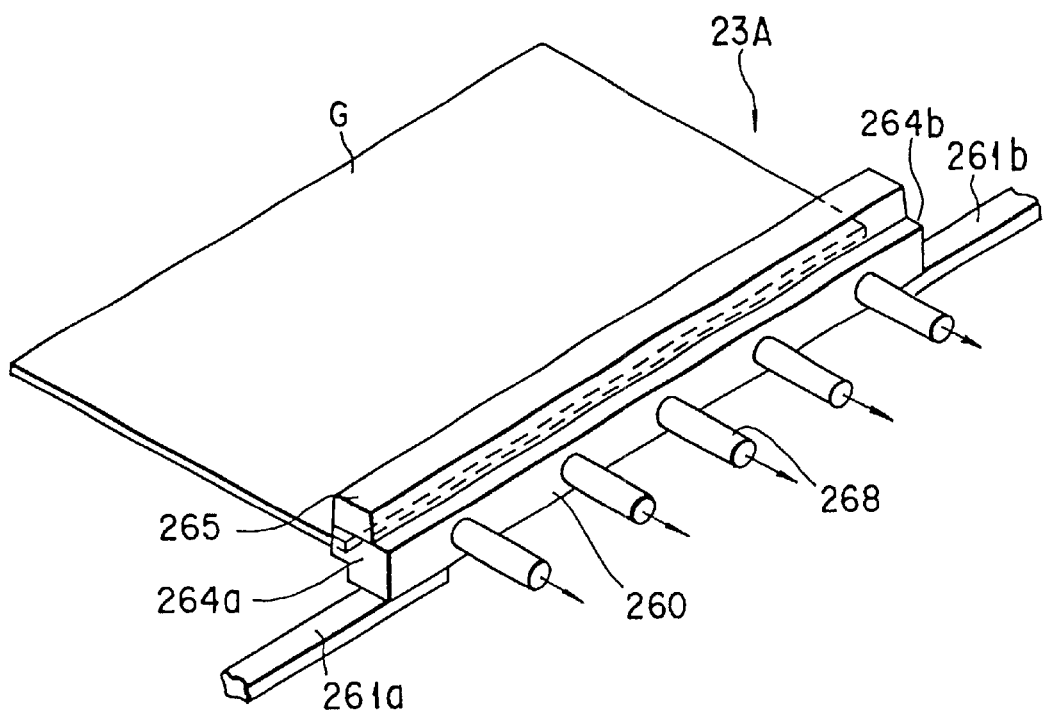
F I G. 22
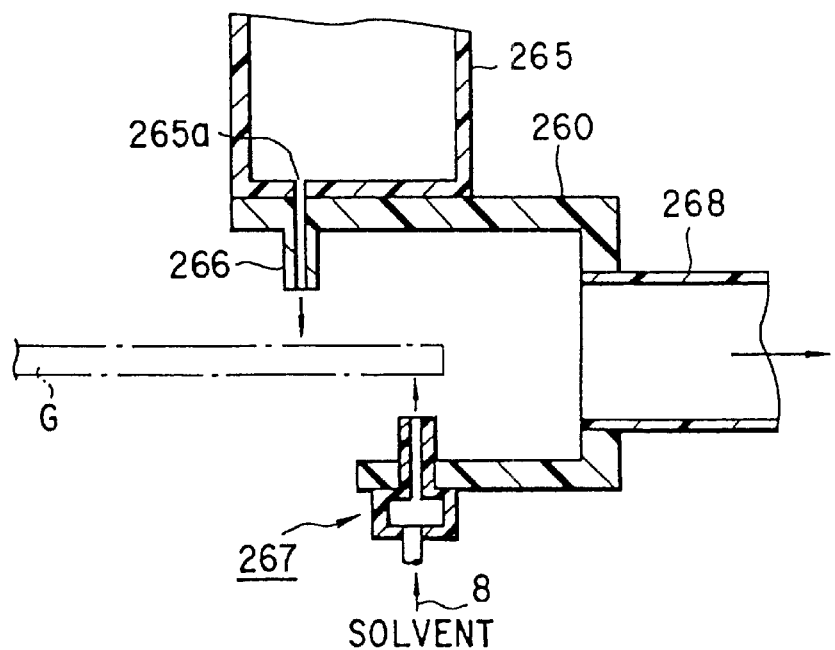
F I G. 23

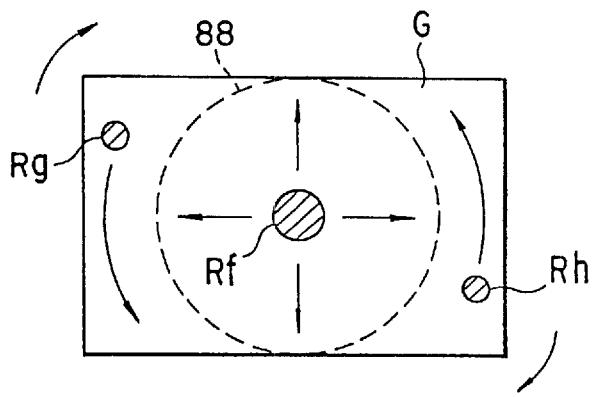
F I G. 27A
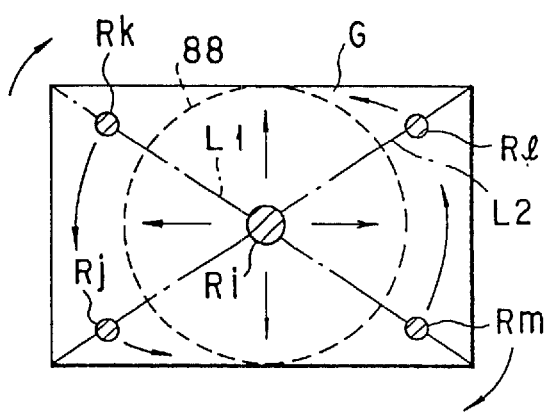
F I G. 27B
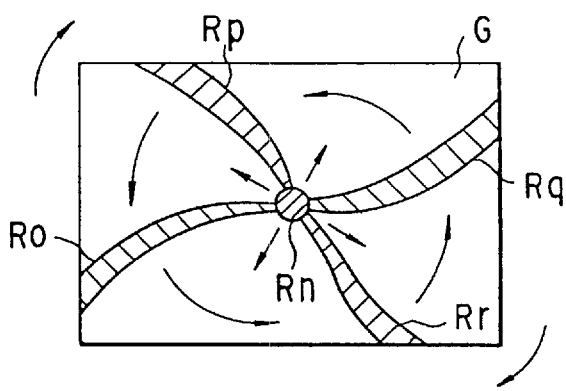
F I G. 27C
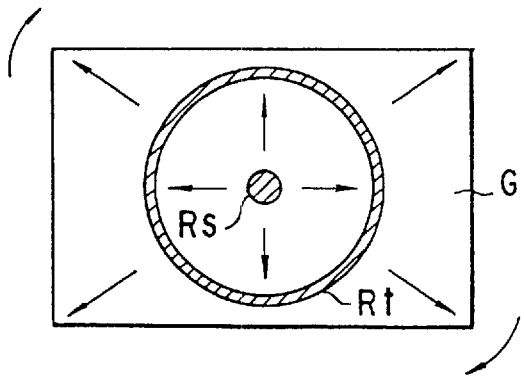
F I G. 27D

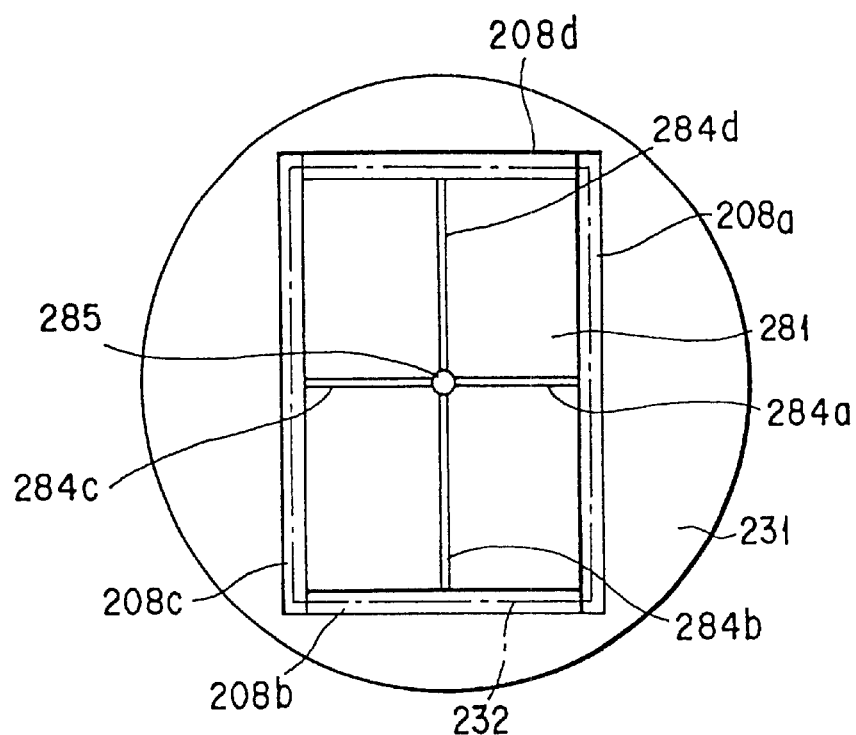
F I G. 32
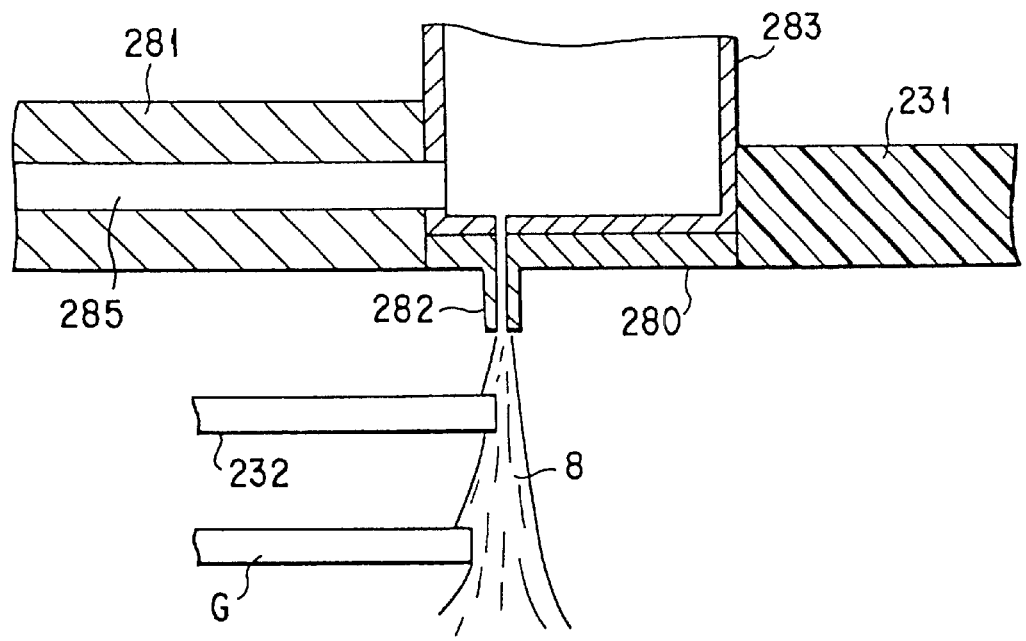
F I G. 33

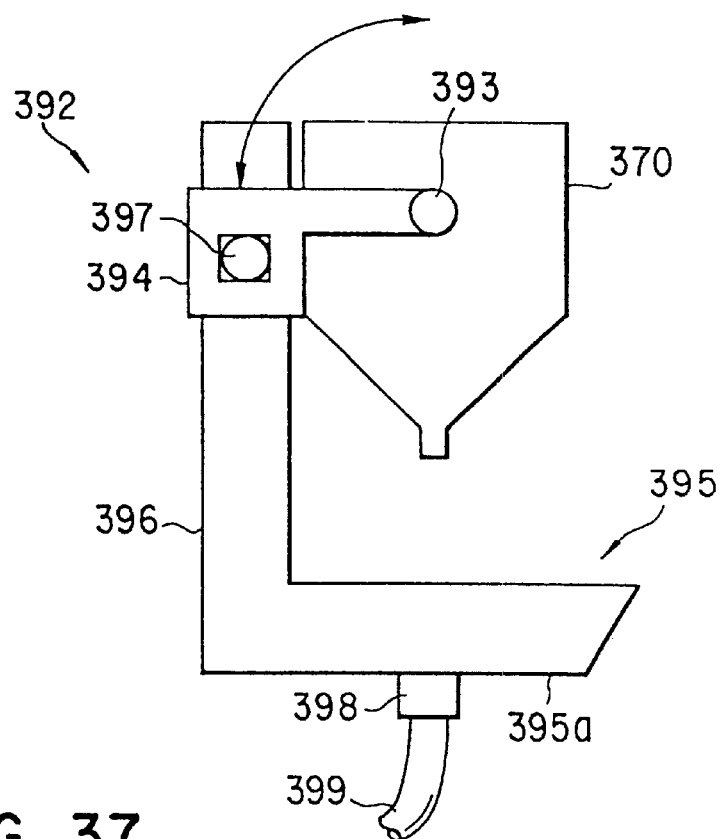
F I G. 37
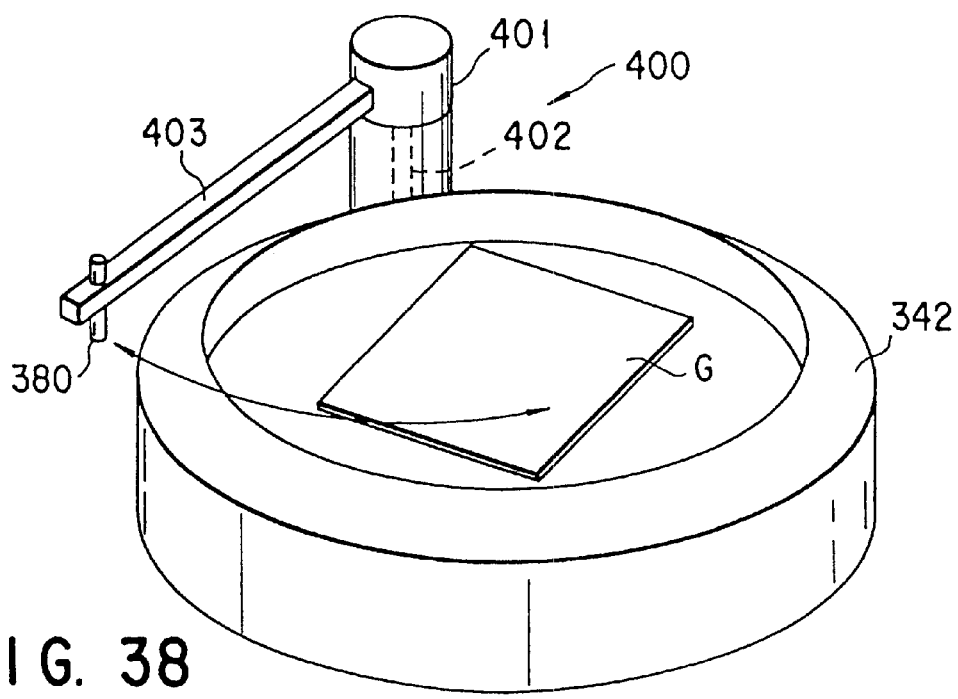
F I G. 38

FILM FORMING APPARATUS

This application is a Continuation of application Ser. No. 09/135,408 filed Aug. 18, 1998 now U.S. Pat. No. 6,165,552.

BACKGROUND OF THE INVENTION

The present invention relates to a film forming method for coating a photo-resist film or an anti-reflective coating on a layer (such as a semiconductor layer, an insulating layer, an electrode layer, or the like) formed on a surface of a substrate or a substrate for a liquid crystal display (LCD).

A photo-lithography technique is used in a process for manufacturing a LCD, like in a process for manufacturing a semiconductor device. In the photo-lithography technique for a LCD, a resist film is formed on a glass substrate and is subjected to pattern exposure and further to development. The semiconductor layer, the insulating layer, the electrode layer, or the like is selectively etched to form thin films and electrode patterns made of ITO.

In general, a so-called spin-coating method is used in case of applying a resist solution onto a LCD substrate. As shown in FIG. 1A, a substrate G is suctioned and maintained by a spin-chuck 701 in the spin-coating method, and both of a solvent and a resist solution 9 are dropped onto a rotation center portion of the substrate G. Subsequently, as shown in FIG. 1B, an upper opening is closed with a lid 713, and a rotation cup 711 and a spin chuck 701 are synchronously rotated. In this manner, as shown in FIG. 2A, the resist solution 9 is diffused from the rotation center portion to the peripheral portion and is thereby coated over the entire upper surface of the substrate G.

When the resist solution 9 must be diffused so as to draw a circle covering the four corner portions of the substrate as shown in FIG. 2B if the resist solution 9 should be applied to the entire substrate G, since the substrate G has a rectangular shape. In the case of diffusing the resist solution to the hatched regions R1 to R4 in the figure, the resist solution 9 is wasted.

However, if the supply amount of the resist solution 9 is decreased too much, the resist solution 9 does not sufficiently reach the corner portions of the substrate G. Therefore, it is conventionally necessary to supply an excessive amount of resist solution 9, and about 90% of the supply amount of the resist solution 9 is disposed of.

In case where the resist is coated in spin-coating method, however, the resist film is thickened to rise at the peripheral edge portion of the substrate due to influences from the surface tension after rotation stops to stop the centrifugal force or as the time is elapsed although the film thickness is uniform immediately after the film is coated. Also, in this method, an excessive portion of resist is shaken off by rotation of the substrate, and the portion of resist thus shaken off is diffused onto the back surface of the substrate so that the resist may stick to unnecessary portions.

Thus, a non-uniform thick film formed at the peripheral portion of the substrate and a resist sticking to the back surface thereof cause generation of particles in a later step of conveying the substrate, and may further soil devices for conveying the substrate.

Therefore, after a resist is coated on the surface of the substrate, processing of removing unnecessary resists sticking to the peripheral edge portion and the back surface of the substrate. This processing is performed after coating the resist, in a manner in which the substrate is conveyed to a resist remover unit adjacent to the resist coating unit, a resist remover nozzle comprising a solvent supply portion and a solvent suction portion is moved along the peripheral edge of the substrate, a solvent for the resist is supplied, and simultaneously, the resist dissolved by supply of the solvent is suctioned and removed.

However, in case of removing a resist using the apparatus as described above, the resist coating unit requires an additional equipment so that the size of the equipment must be inevitably enlarged. In addition, the nozzle must be moved with the substrate inserted in a narrow gap between the solvent supply portion and the solvent suction portion of the resist remover nozzle. Therefore, the accuracy of the positions of the substrate and the nozzle relative to each other must be high. Demands for such position accuracy become higher and higher as the size of the substrate has come to be enlarged in recent days.

BRIEF SUMMARY OF THE INVENTION

The present invention has an object of providing a film forming method capable of reducing the consumption of a process liquid where a film having a uniform film thickness is formed on a substrate.

A coating film forming method comprising the steps of: (a) rotatably holding a substrate by a spin chuck; (b) supplying a solvent for a coating film to a first portion deviated from a rotation center portion of the substrate; (c) supplying a process liquid to a second portion which is at the rotation center of the substrate; and (d) diffusing the process liquid from the second portion to a periphery thereof by rotating the substrate.

Another coating film forming method comprising the steps of: (g) rotatably holding a rectangular substrate by a spin chuck; (h) supplying a solvent for a coating film to a first portion deviated from a rotation center portion of the substrate; (i) supplying a process liquid to a second portion which is at the rotation center of the substrate; and (j) diffusing the process liquid from the second portion to a periphery thereof by rotating the substrate.

In the steps (c), it is preferable that rotation of the substrate is stopped or rotated at low speed, and the process liquid is supplied to the second portion. In this case, the amount of scattered liquid is reduced when supplying the process liquid, and the generation amount of mist is reduced, so that the generation amount of particles is reduced.

Since the solvent is familiar with the process liquid (i.e., the process liquid has a high solubility with respect to the solvent), the solvent does not repel the processing liquid but the process liquid smoothly moves on the substrate when the process liquid supplied onto the substrate is brought into contact with the solvent. The solvent is thinner where the process liquid is a resist solution, for example. Otherwise, the solvent is water where the process liquid is a development liquid, for example.

A coating film forming method comprising the steps of: (g) rotatably holding a rectangular substrate by a spin chuck; (h) supplying a solvent for a coating film to a first portion deviated from a rotation center portion of the substrate; (i) supplying a process liquid to a second portion which is at the rotation center of the substrate; and (d) diffusing the process liquid from the second portion to a periphery thereof by rotating the substrate.

The "portion (or first portion) deviated from the rotation center of the substrate" indicates a region (or portion) which is deviated from the center point of the substrate when the substrate is rotated by the spin chuck and which is positioned between the center position of the substrate and the peripheral edges. In addition, the "rotation center portion (or second portion) of the substrate" indicates a narrow region (or portion) including the center point of the substrate when the substrate is rotated by the spin chuck and the vicinity of the center point.

The process liquid (or main liquid) supplied from the first nozzle diffuses up to the peripheral edges in the sides of the short edges of a rectangular substrate from the first portion (or the portion at the rotation center portion of the substrate), but is difficult to diffuse (or reach) to the peripheral edges in the sides of the long edges of the rectangular substrate or to the corner portions thereof. In particular, the process liquid (or main liquid) is insufficient at the corner portions of the rectangular substrate. However, the process liquid (or supplementary liquid) supplied from the second nozzle diffuses (or reaches) rapidly and easily to the corner portions. This is because there is only a short distance from the second portion (or the portion deviated from the rotation center portion of the substrate) to the peripheral edges of the rectangular substrate in the long edges of the rectangular substrate or the corner portions thereof.

A coating film forming method comprising the steps of: (k) rotatably holding a substrate by a spin chuck; (l) supplying a solvent for a coating film onto the substrate by a solvent supply nozzle; (m) supplying a process liquid on the substrate by a process liquid supply nozzle; (n) diffusing the process liquid by rotating the substrate; and (p) supplying the solvent to a peripheral portion of the substrate by the solvent supply nozzle.

In so-called pre-wet processing, a solvent is supplied to a substrate prior to resist application processing in order to restrict the consumption of the resist solution. In the present invention, the same nozzle as used in the pre-wet processing is used to remove a film from peripheral edge portions of the substrate. Therefore, the consumption of the resist solution decreases, any specialized equipment is not required additionally to remove a film from the peripheral edge portions of the substrate and position of the nozzle with respect to the substrate can be facilitated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 22 is a perspective view showing a peripheral edge film remover section;

FIG. 23 is a cross-sectional view showing the peripheral edge film remover section;

FIGS. 27A to 27D are schematic plan views showing a film forming method according to another embodiment of the present invention;

FIG. 32 is a lateral cross-sectional view showing a lid having a film remover section;

FIG. 33 is a longitudinal cross-sectional view showing an enlarged film remover section provided at the lid;

FIG. 37 is a side view showing a receiver member detachably attached to the solvent supply nozzle;

FIG. 38 is a perspective view showing the outline of a movement mechanism for moving the resist solution supply nozzle;

DETAILED DESCRIPTION OF THE INVENTION

In the following, various embodiments of the present invention will be explained with reference to the attached drawings.

Figure 1A:
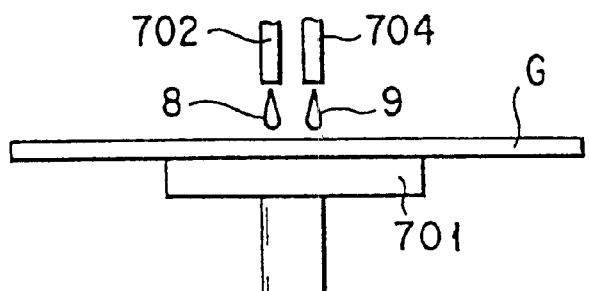
FIGS. 1A to 1C are schematic cross-sectional views for explaining a conventional film forming method.
Figure 1B:
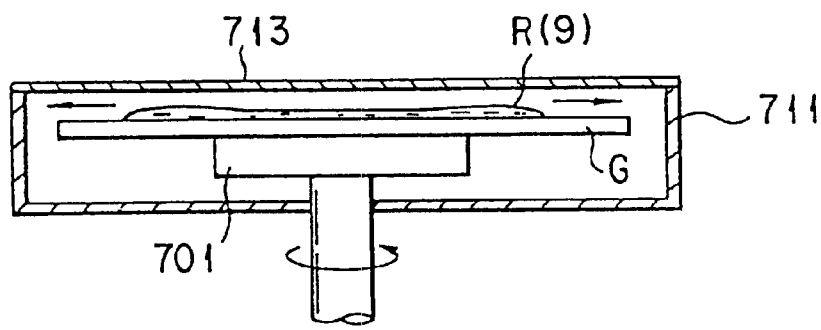
Figure 1C:
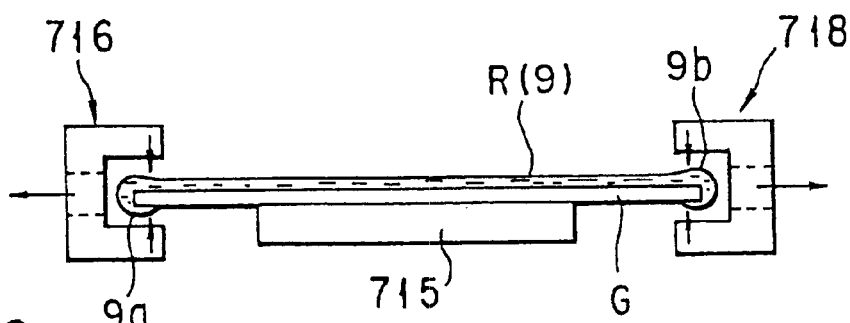
Figure 2A:
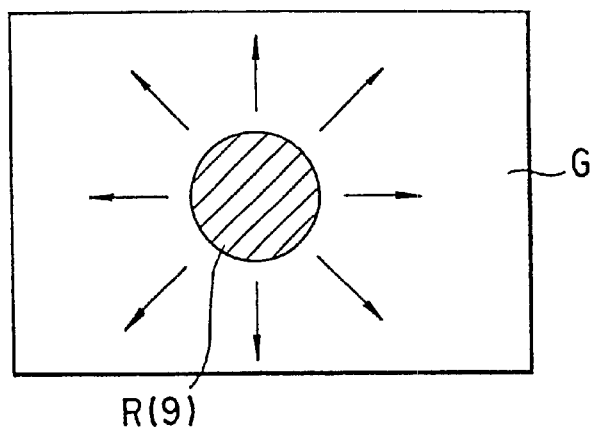
FIGS. 2A and 2B are schematic plan views for explaining a conventional film forming method.
Figure 2B:
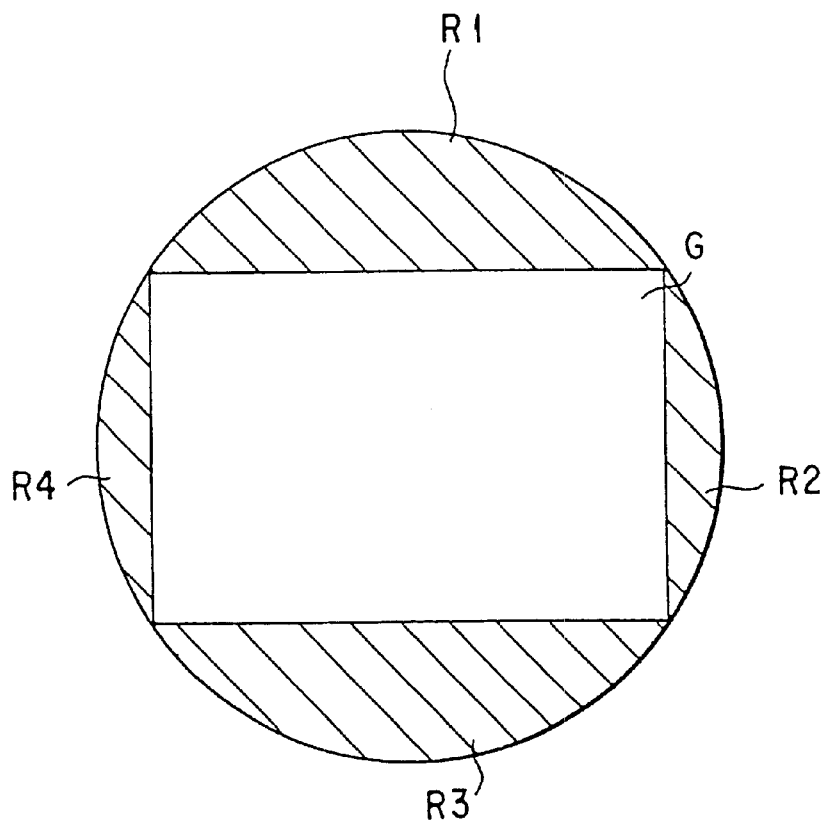
Figure 3:
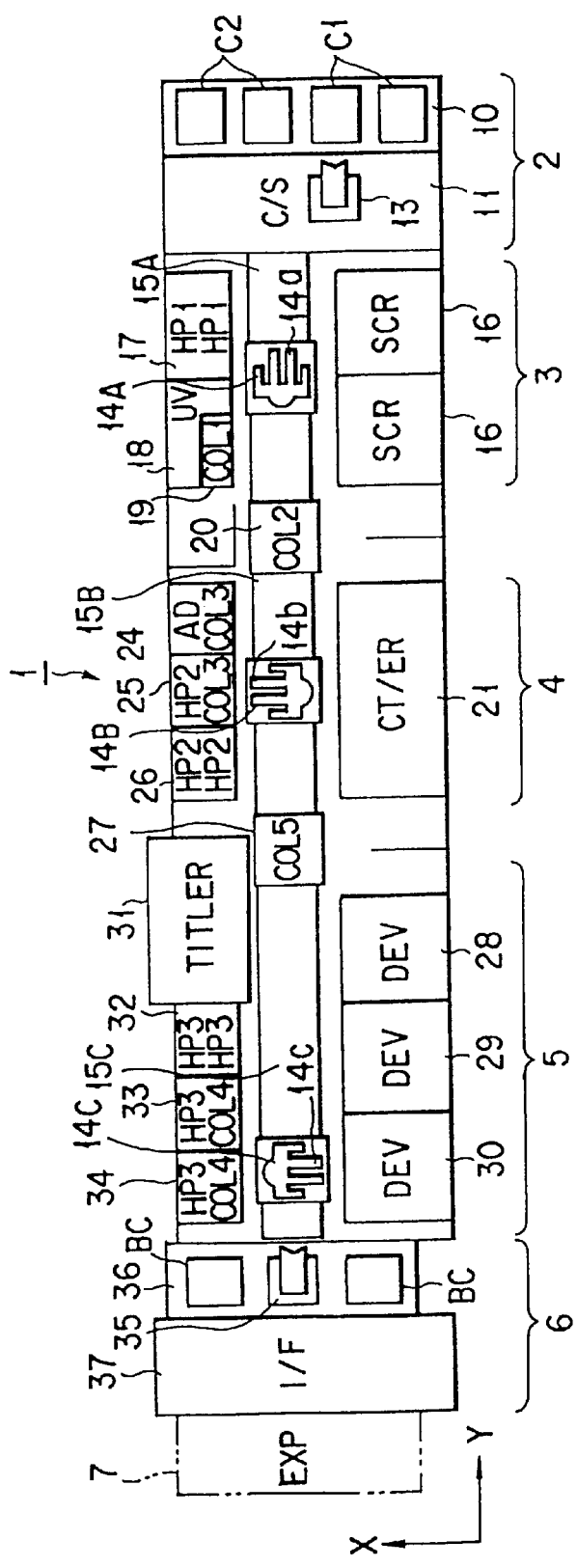
FIG. 3 is a plan layout showing the outline of a processing system for subjecting a LCD substrate to resist processing.
Figure 4:
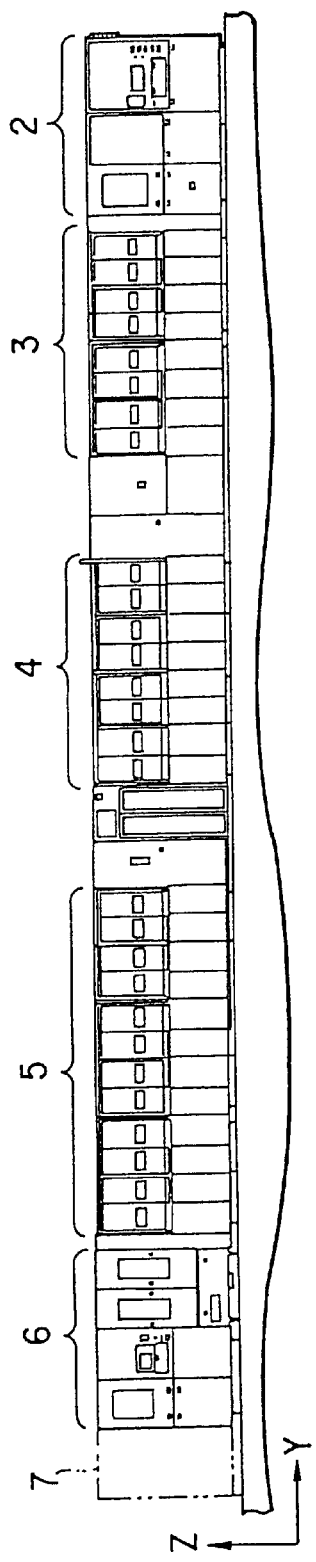
FIG. 4 is a front outer view of the LCD substrate processing system.

As shown in FIGS. 3 and 4, a coating/development processing system 1 comprises a loader/unloader section 2, a first process section 3, a second process section 4, a third process section 5, and an interface section 6. The processing system 1 comprises various processing mechanisms for applying a photoresist solution to a LCD substrate G and for performing development and is connected with an exposure device 7 through an interface section 6.

The loader/unloader section 2 comprises a cassette mount 10 and a conveyer section 11 both extending in the X-axis direction. At most four cassettes C1 and C2 are mounted and disposed on the cassette mount 10. LCD substrates G not yet processed are contained in two cassettes C1, and LCD substrates G already processed are contained in the other two cassettes C2. For example, each of the cassettes C1 and C2 is capable of twenty LCD substrates G at most.

The conveyer section 11 of the loader/unloader section 2 is provided with a first sub-arm mechanism 13.

The first sub-arm mechanism 13 comprises a holder for inserting and exserting substrates G into and from the cassettes C2 and C2, a drive mechanism for moving forwards or backwards the holder, a X-axis drive mechanism for moving the holder in the X-axis direction, a Z-axis movement mechanism for moving the holder in the Z-axis direction, and a θ-rotation drive mechanism for swinging and rotating the holder around the Z-axis.

The first process section 3 comprises a center conveyer path 15A extending in the Y-axis direction, a first main arm mechanism 14A arranged to be capable of running along the conveyer path 15A, and a plurality of processing units 16, 17, 18, and 19. Two wet cleaning units 16 are provided in one side of the conveyer path 15A. The unit 16 comprises a brush scrubber SCR for scrub-cleaning the surfaces of the substrates G with a rotation brush while applying a cleaning processing liquid to the substrates G. A heater unit 17, a dry cleaning unit 18, and a cooler unit 19 are provided at the other end of the conveyer path 15A. The heater unit 17 comprises hot plates HP1 arranged in two stages of upper and lower stages to heat the substrates G. The dry cleaning unit 18 comprises an ultraviolet cleaning device UV for cleaning the surfaces of the substrates G by irradiating ultraviolet rays to the substrates G, to clean the surfaces of the substrates G. The cooler unit 19 comprises a cooling plate COL1 for cooling the substrates G. The first main arm mechanism 14A comprises a holder 14a for holding the substrates G, a drive mechanism for moving forwards or backwards the holder 14a, a Y-axis drive mechanism for moving the holder 14a in the Y-axis direction, a Z-axis movement mechanism for moving the holder 14a in the Z-axis direction, and a θ-rotation drive mechanism for swinging and rotating the holder 14a around the Z-axis.

The second process section 4 comprises a center conveyer path 15B extending in the Y-axis direction, a second main arm mechanism 14B arranged to be capable of running along the conveyer path 15B, and a plurality of processing units 21, 24, 25, and 26. A resist-coater/peripheral-edge-resist-remover unit 21 is provided in one side of the conveyer path 15B. The unit 21 comprises a coating device CT for applying a resist solution while spin-rotating the substrates G, and a peripheral-edge resist remover device ER for removing a resist film from the peripheral edge portions of the substrates G. An adhesion/cooling unit 24, a heating/cooling unit 25, and a heating/heating unit 26 are provided in the other side of the conveyer path 15B. The adhesion/cooling unit 24 comprises an adhesion device AD for processing the surfaces of the substrates G to be hydrophobic by vapor of HMDS, and a cooling plate COL3 for cooling the substrates G. The heating/cooling unit 25 comprises a hot plate HP2 for heating the substrates G, and a cooling plate COL3 for cooling the substrates G. The heating/heating unit 26 comprises hot plates HP2 arranged in two stages of upper and lower stages, to heat the substrates G.

The third process section 5 comprises a center conveyer path 15C extending in the Y-axis direction, a third main arm mechanism 14C arranged to be capable of running along the conveyer path 15C, and a plurality of processing units 28, 29, 30, 31, 32, 33, and 34. Three development units 28, 29, and 30 are provided in one side of the conveyer path 15C. Each of the units 28, 29, and 30 comprises a development device DEV for developing and processing a resist film by applying a development liquid to the substrates G. A titler 31, a heating/heating unit 32, and heating/cooling units 33 and 34 are provided in the other side of the conveyer path 15C. Note that each of the second and third main arm mechanisms 14B and 14C has a substantially same structure as the first main arm mechanism 14A. In addition, a cooling unit 20 is provided between the first process section 3 and the second process section 4, and a cooling unit 27 is provided between the second process section 4 and the third process section 5. The cooling units 20 and 27 are used for temporarily keep the substrates G on standby for processing.

The interface section 6 is provided between the third process section and the exposure device 7. The interface section 6 comprises a convey/standby section 36 and a delivery section 37. The convey/standby section 36 is provided with a second sub-arm mechanism 35 and two buffer cassettes BC. The second sub-arm mechanism 35 is substantially the same as the first sub-arm mechanism 13. Substrates G waiting for processing are contained in each of the buffer cassettes BC, and the substrates G are temporarily kept on standby in these cassettes. The delivery section 37 is provided with a delivery table (not shown), and the substrates G are delivered between the conveyer mechanism (not shown) of the exposure device 7 and the second sub-arm mechanism 35.

In the next, the resist-application/peripheral-edge-resist remover unit 21 will be explained below with reference to FIGS. 5 to 9.

Figure 5:
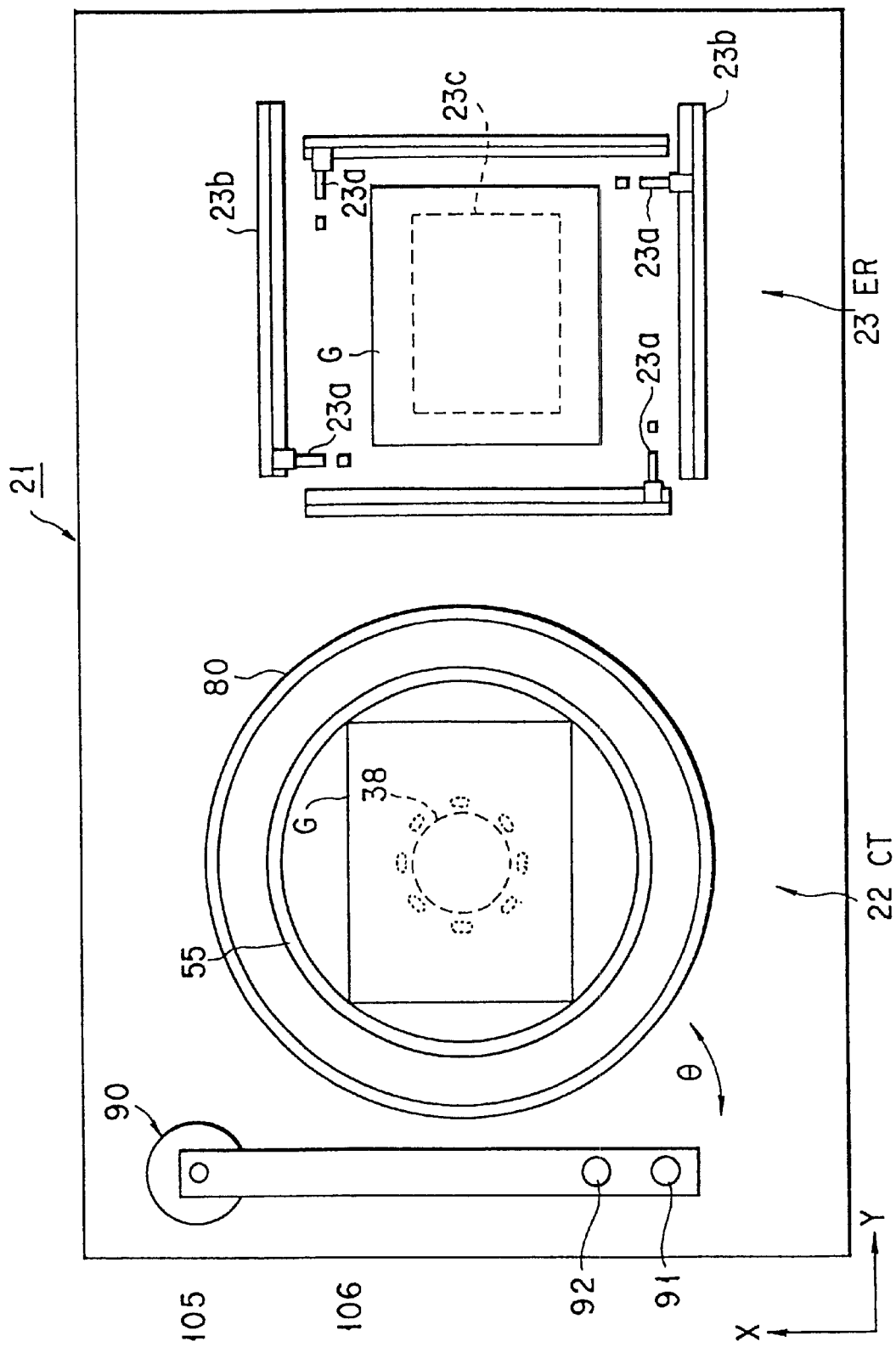
FIG. 5 is a plan view showing the outline of a resist-forming/peripheral-edge-resist-remover unit.

As shown in FIG. 5, the unit 21 comprises a resist application device 22 (CT) and a resist remover device 23 (ER). Two opening/closing ports (not shown) are formed in the front wall of the unit 21. A substrate G is conveyed into the resist application device 22 through one of the opening/closing ports, and a substrate G is conveyed out of the peripheral edge resist remover device 23 through the other opening/closing port. Note that a transfer mechanism (not shown) is provided between the resist application device 22 and the peripheral edge resist remover device 23, so that a substrate G can be transferred from the resist application device 22 toward the peripheral edge resist remover device 23.

Figure 6:
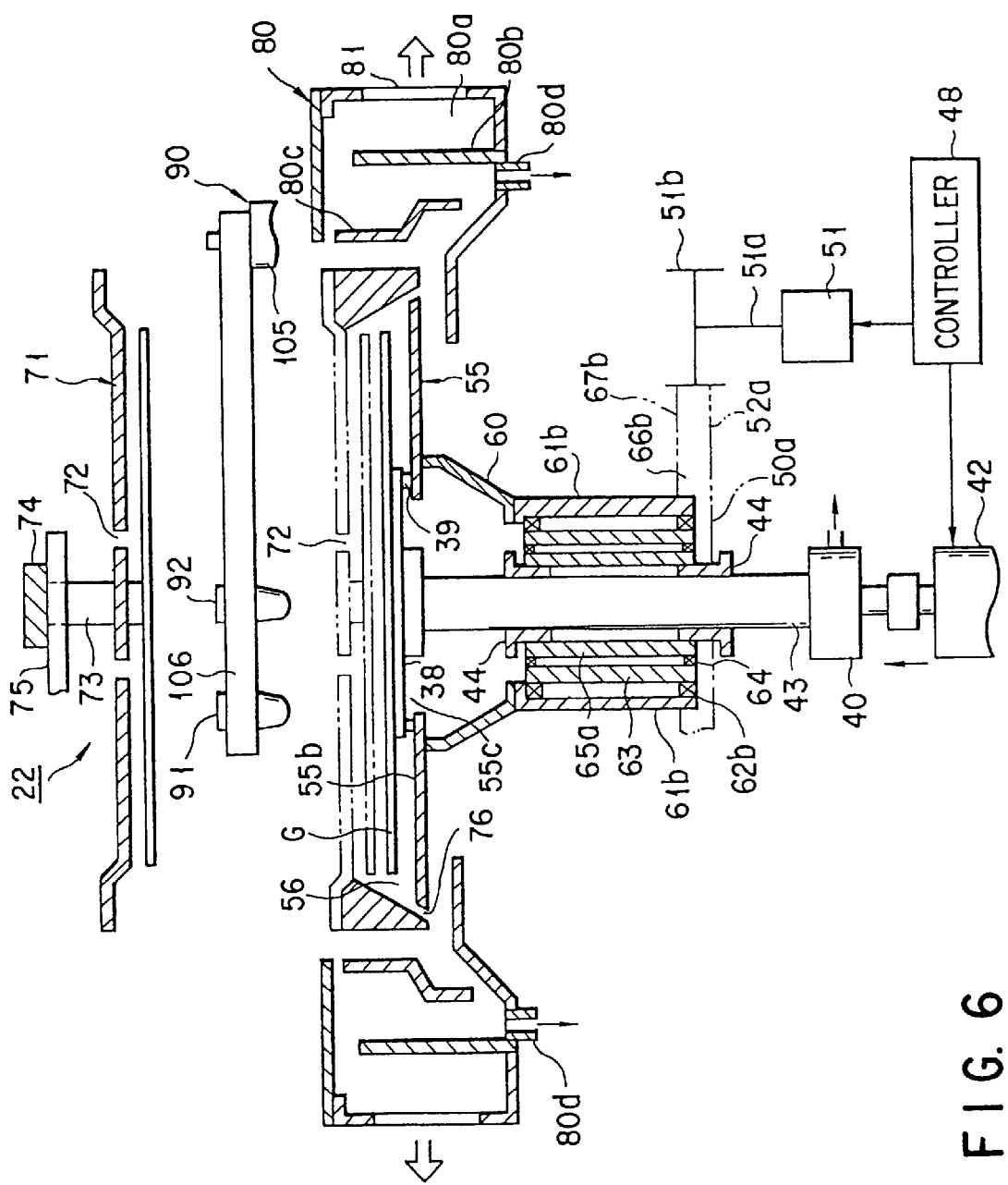
FIG. 6 is a perspective cross-sectional view showing the outline of an apparatus used in the film forming method according to an embodiment of the present invention.

As shown in FIG. 6, the resist application device 22 comprises a spin chuck 38, a rotation cup 55, a drain cup 80, and a resist solution supply mechanism 90. The spin chuck 38 comprises a vacuum suction mechanism (not shown) for suctioning and holding a substrate G, and a rotation drive mechanism 42 for rotating a substrate G. The rotation cup 55 is provided so as to surround the periphery of the spin chuck 38. Further, the drain cup 80 is provided so as to surround the periphery of the rotation cup 55. A lid 71 is arranged to be covered over an upper opening of the rotation cup 55. A plurality of drain tubes 80d are equipped on the bottom portion of the drain cup 80, and mist and a waste liquid are drained through the drain tubes 80d to a collection/recycle device (not shown). A processing liquid supply mechanism 90 comprises a solvent supply nozzle 91, a resist supply nozzle 92, a motor 105, and a swing arm 106.

The peripheral edge resist remover device 23 comprises four solvent discharge nozzles 23a and a scanning movement mechanism 23b for moving the nozzles 23a so as to scan a substrate G along the edges thereof, and a mount 23c for suctioning and holding the substrate G.

In the next, the resist application device 22 will be explained more specifically with reference to FIGS. 6 to 9.

A rotation shaft 43 is connected to a lower portion of the spin chuck 38. The rotation shaft 43 is connected with an elevation cylinder 42 through a vacuum seal portion 40 and is slidably supported on a lower portion of the rotation cup 55 through a sprite bearing 44.

Further, the sprite bearing 44 is equipped with a slave pulley 50a, and a belt 52a is bridged between the slave pulley 50a and a drive pulley 51b. The drive pulley 51b is installed on a drive shaft 51a of a motor 51. In addition, the spin chuck 38 is supported so as to elevate freely by an elevation cylinder 42.

The rotation cup 55 is provided so as to surround an upper portion and an outer peripheral portion of the spin chuck 38. A processing chamber 56 for processing a substrate 55 is formed inside the rotation cup 55, and an opening portion 55c is formed at the center of the lower surface 55b of the rotation cup 55. The spin chuck 38 is inserted into the processing chamber 56 from the opening portion 55c.

At the lower portion of the rotation cup 55, the lower surface 55b of the rotation cup 55 is connected to an upper end portion of the rotation outer cylinder 61b through a connection cylinder 60, and the rotation outer cylinder 61b is connected to a fixed collar 63 through a bearing 62b. The fixed collar 63 is connected to the rotation inner cylinder 65a through a bearing 64, and a rotation shaft 43 is connected to the rotation inner cylinder 65a through a spline bearing 44. Further, labyrinth seals (not shown) are respectively formed on surfaces of the fixed collar 63 and the rotation inner cylinder 65a opposed to each other and surfaces of the fixed color 63 and the rotation outer cylinder 61b opposed to each other. Particles generated by lower drive mechanisms 42, 44, 51, 51a to 52a, 62b, and 64 are prevented from entering into a processing space 56 by the labyrinth seals.

The rotation outer cylinder 61b is equipped with a slave pulley 66b. A rotation drive force is transferred to the slave pulley 66b from a drive pulley 51b of a motor 51 through a belt 67b from the slave pulley 66b. Meanwhile, the diameter of the slave pulley 50a is equal to the diameter of the slave pulley 66b, and both of these pulleys are driven and rotated by a common motor 51, so that the spin chuck 32 and the rotation cup 55 are rotated in synchronization with each other.

Figure 7:
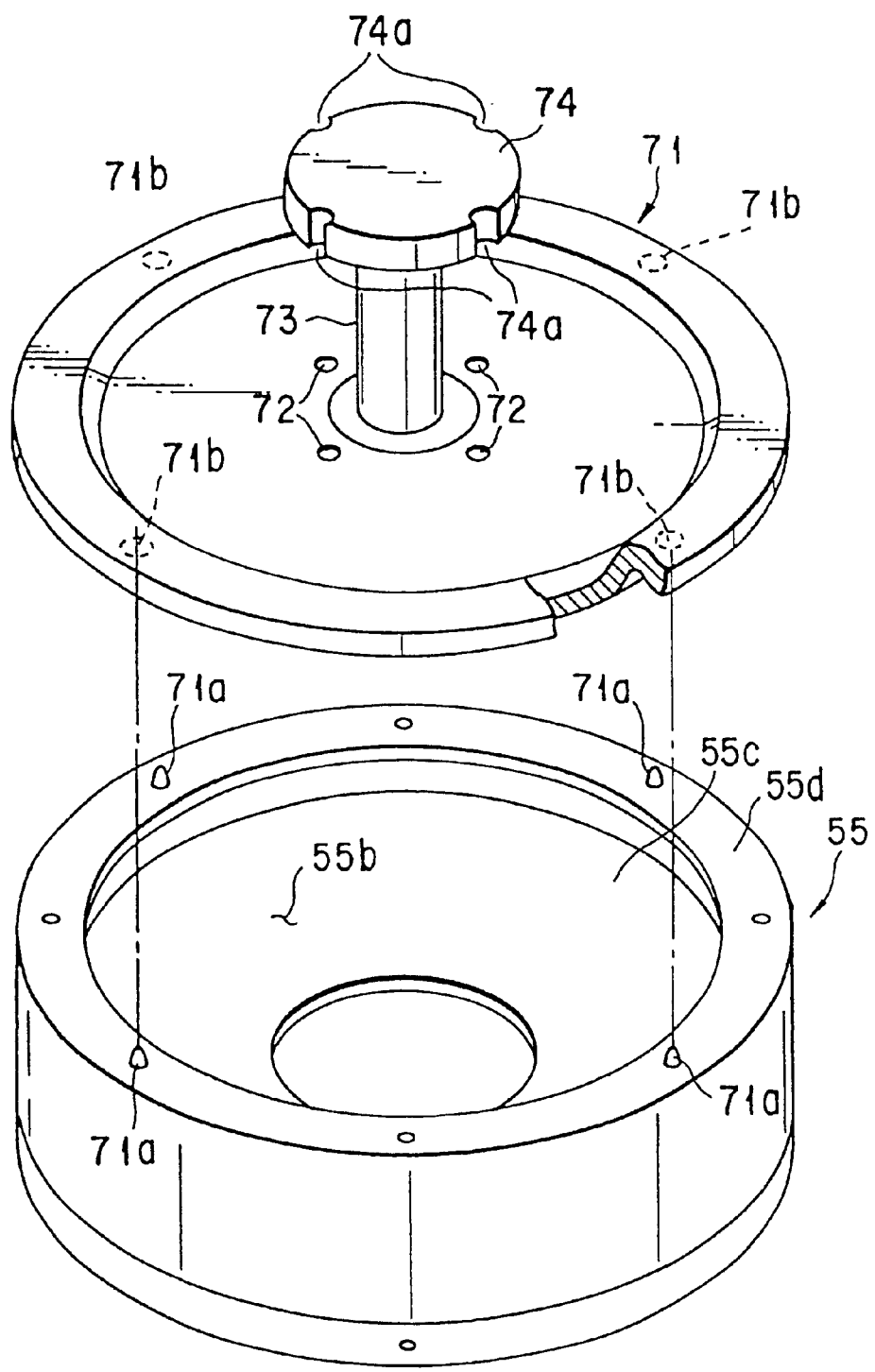
FIG. 7 is an exploded perspective view showing a rotation cup and a lid.

As shown in FIG. 7, a plurality of fixing pins 71a are projected upwards from the upper surface 55d of the rotation cup surrounding the upper opening 55c. The fixing pins 71a are arranged to be engaged respectively with concave portions 71b of the lid 71, and the lid 71 is engaged with the lid 71 by respectively engaging the concave portions 71b with the fixing pins 71a. In addition, each of the top portions of the fixing pins 71a is formed like a spherical surface so that dust is prevented from being generated by contacts between the top portions and the concave portions 71b.

As shown in FIGS. 6 and 7, a plurality of air supply ports 72 are penetrated through the vicinity of the center of the lid 71. In addition, a support portion 73 extends from the center of the lid 71. A plurality of stopper grooves 73a are formed in the support portion 73. The stopper grooves 73a are engaged with engaging pins (not shown) projected from a robot arm 75, and the lid 71 is detached from the rotation cup 55 by these components.

The side wall of the rotation cup 55 are formed such that the inner side surface thereof is in a tapered shape whose diameter decreases upwards. Therefore, when an air is supplied from an air supply port 72 of the lid 71, the air flows along the upper surface of a substrate G and further along the tapered surface. The air is drained to the drain cup 80 through a lower exhaust port 76 of the rotation cup 55.

The drain cup 80 is provided so as to surround the rotation cup 55. The drain cup 80 is formed like a hollow ring-like shape. The drain cup 80 receives a waste liquid and waste mist drained from the rotation cup 55, and exhausts the liquid and mist to a drain unit (not shown) and an exhaust unit (not shown) or a recycle unit (not shown). A circular path 80a is provided inside the drain cup 80. The circular path 80a is divided like a detour (or crank) by a wall 80b standing on the bottom portion of the drain cup 80 and a wall 80c hanging from a ceiling portion of the drain cup 80. A plurality of drain ports 80d are formed in the bottom portion positioned between the walls 80b and 80c.

For example, four exhaust ports 81 are formed in the outer circumferential wall of the circular path 80a, and each of the exhaust ports 81 communicates with the suction side of the exhaust unit (not shown). Mist of a resist solution generated in the processing chamber 56 flows to the drain cup 80 through the exhaust port 76, and is further exhausted to the outside through the exhaust ports 81 through the circular path 80a.

Figure 8:
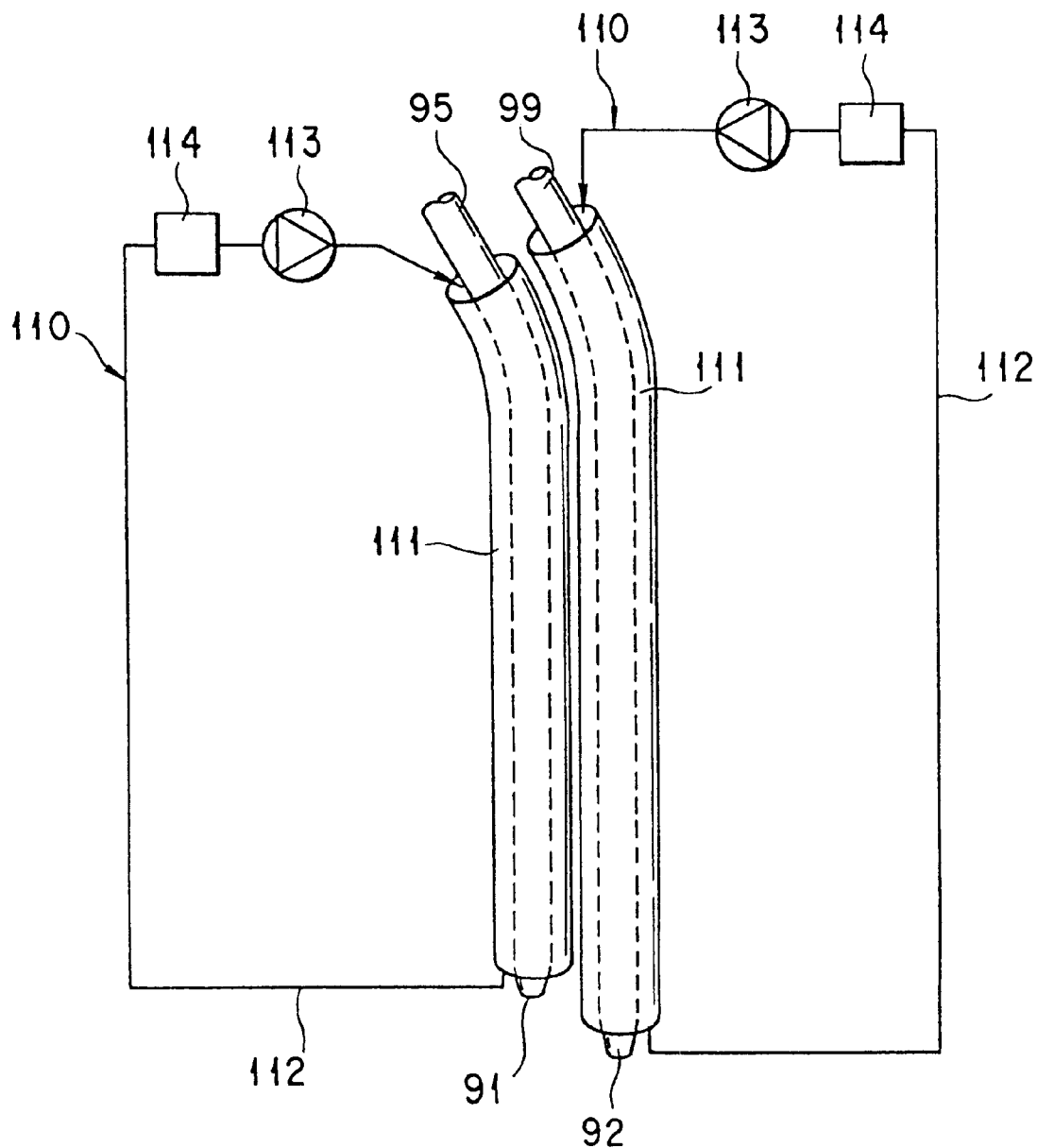
FIG. 8 is a perspective block diagram showing a temperature control circuit for a solvent supply nozzle and a resist solution supply nozzle.
Figure 9:
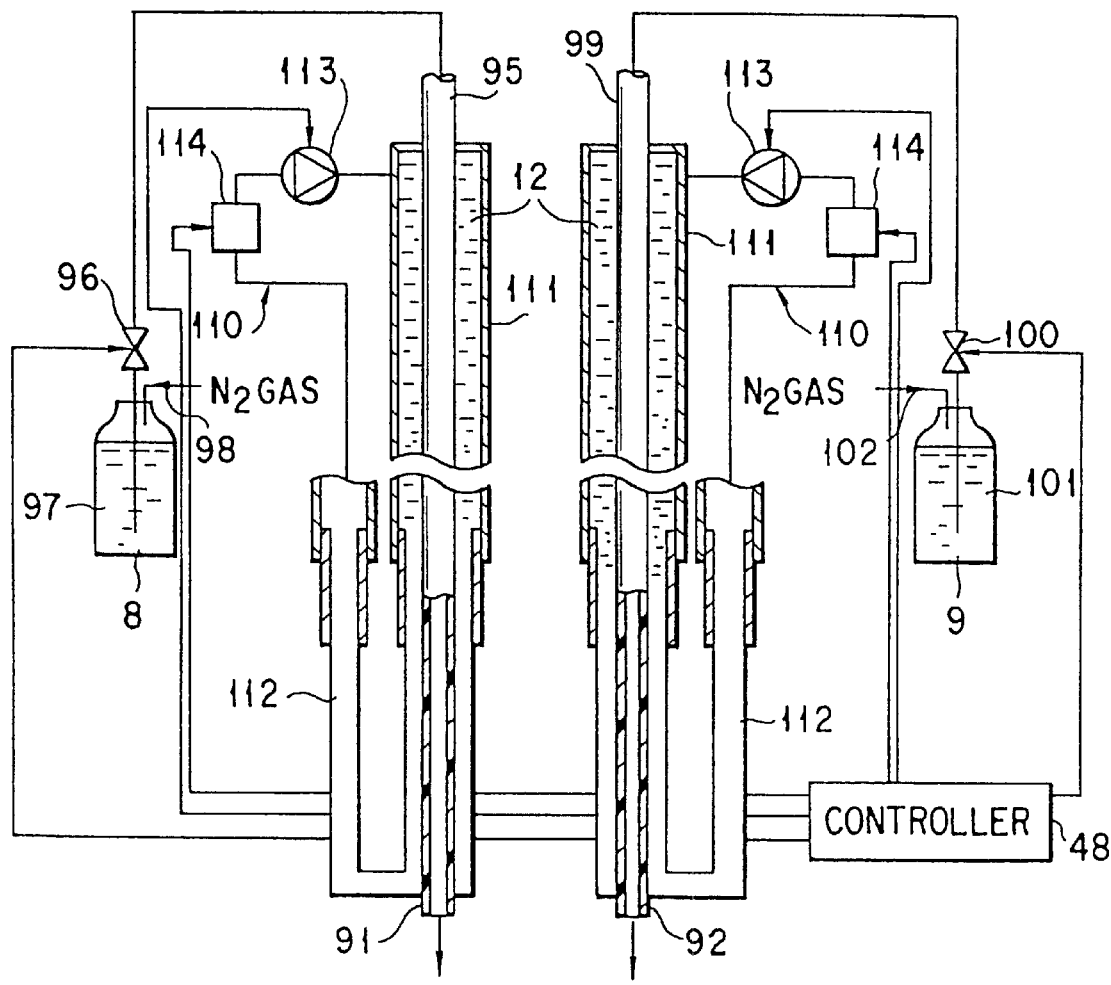
FIG. 9 is a cross-sectional block diagram showing a process solution supply circuit for the process solution supply nozzle and the resist solution supply nozzle.
Figure 9:
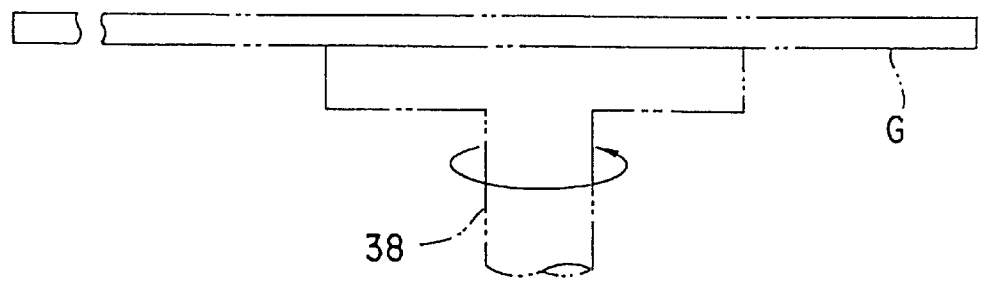
Figure 10:
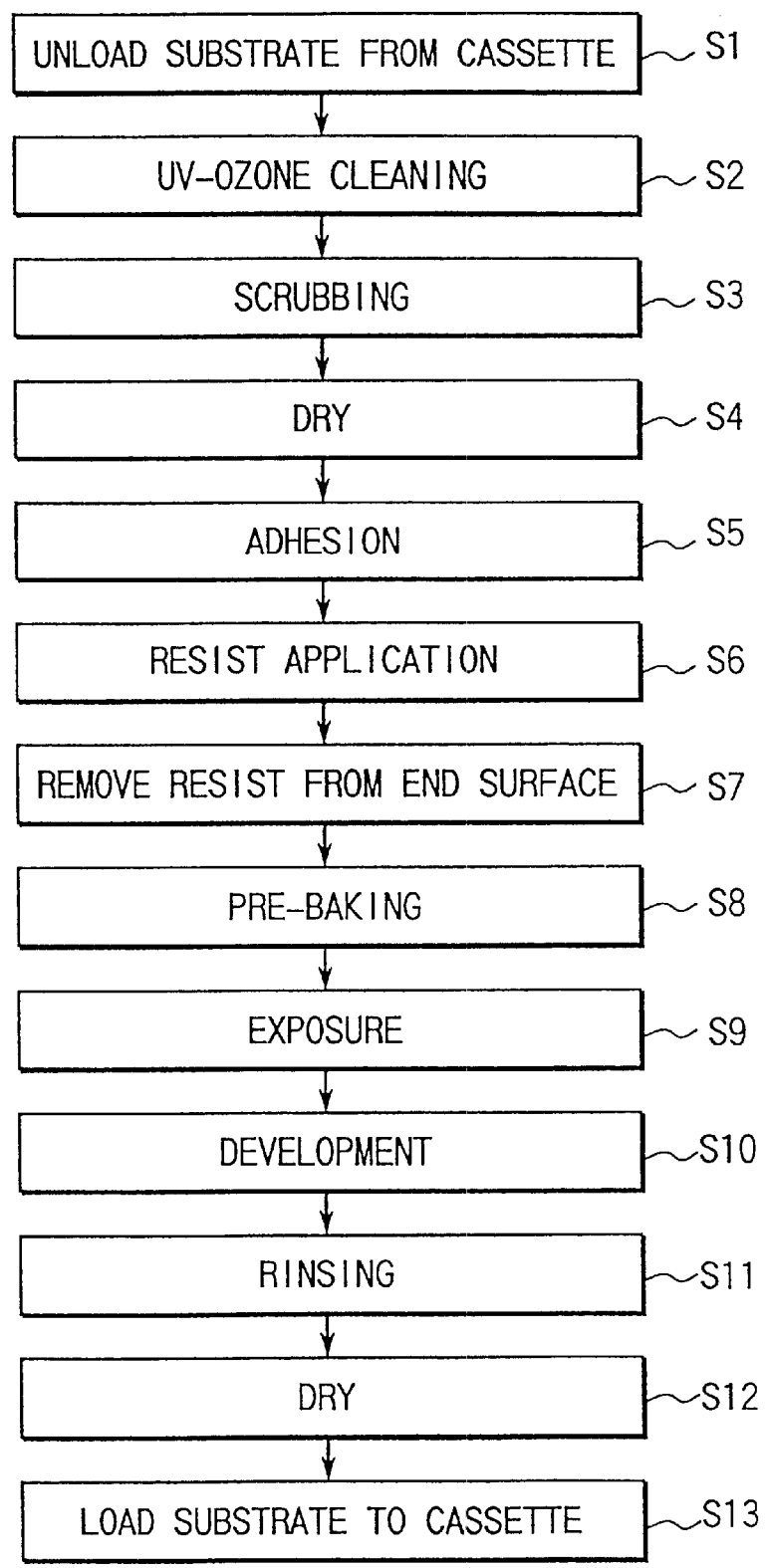
FIG. 10 is a flowchart showing a series of resist processing steps for the LCD substrate.

As shown in FIGS. 8 and 9, the processing liquid supply mechanism 90 comprises a solvent supply nozzle 91 for discharging and supplying a solvent 9, a resist solution supply nozzle 92 for discharging and supplying a photoresist solution 9. The nozzles 91 and 92 are installed and supported on the top end portion of a common horizontal arm 106. The base end portion of the horizontal arm 106 is connected to and supported on a swing mechanism 105. The swing mechanism 105 comprises a stepping motor (not shown). By the stepping motor, the horizontal arm 106 is swung around the Z-axis by the stepping motor, and the nozzles 91 and 92 are moved between a home position and a use position, as shown in FIG. 5.

As shown in FIG. 9, the solvent supply nozzle 91 communicates with the tank 97 through the tube 95. The tube 95 is provided with an opening/closing valve 96 controlled to be turned on/off by a controller 48. A solvent 8 is contained in the tank 97, and a pressure gas supply source (not shown) communicates with the tank 97 through a supply tube 98. Operation of the pressure gas supply source is controlled by the controller 48, and the supply amount of the solvent 8 conveyed to the nozzle 91 is adjusted by controlling a gas pressure by the controller 48. The solvent 8 will be, for example, propyleneglycolmonomethyletheracetate (PGMEA), an ethyllactate (EL), ethyl-3-ethoxypropione (EEP), or the like.

The resist solution supply nozzle 92 is constructed in a substantially same structure as the solvent supply nozzle 91. The resist solution supply nozzle 92 communicates with the tank 101 through a tube 99. The tube 99 is provided with an opening/closing valve 100 controlled to be turned on/off by the controller 49. A photoresist solution 9 is contained in the tank 101, and a pressure gas supply source (not shown) communicates with the tank 101 through a supply tube 102. Operation of the pressure gas supply source is controlled by the controller 48, and the supply amount of the photoresist solution 9 fed to the nozzle 92 is adjusted by controlling the gas pressure by the controller 48. The photoresist solution 9 may be, for example, a solution in which a mixture of a quinonediazide-based photosensitive agent and phenol-based resin (which is alkaline-soluble) is dissolved in an appropriate amount of solvent 8.

Further, the temperatures of the solvent 8 flowing through the tube 95 and the resist solution flowing through the tube 99 are respectively controlled to target temperatures by a temperature control mechanism 110. That is, as shown in FIG. 9, jackets 111 are provided so as to surround the outsides of the jackets 111, respectively. A heat exchange medium 12 is circulated in each jacket 111 through a circulation circuit 112. A pump 113 and a thermo module 114 are provided in this order on the circulation circuit 112. Operation of the pump 113 and the thermo module 114 is controlled by the controller 48. The thermo module 114 serves to maintain the heat exchange medium 12 at a constant set temperature. Note that the tubes 95 and 99 are respectively surrounded by the jackets 111 nearly to the vicinity of the top end portions. In this manner, the temperatures of the solvent 8 and the resist solution 9 are controlled to target temperatures (e.g., 23° C.).

Next, a series of resist processing of a LCD substrate will be explained with reference to FIGS. 10 to 14. In particular, detailed explanation will be made of a case of applying a resist to a substrate G.

One piece of substrate G is picked up from a cassette C1 by the first sub-arm mechanism 13 (in a step S1). The substrate G is delivered to the first main arm mechanism 14A from the first sub-arm mechanism 13. The first main arm mechanism 14A conveys the substrate G to the first main arm mechanism 14A from the first sub-arm mechanism 13. In the cleaning unit 18, ultraviolet rays are irradiated to the substrate G in the presence of ozone to subject the surface of the substrate G to UV-ozone cleaning (in a step S2). Further, the substrate G is conveyed to the cleaning unit 16 by the first main arm mechanism 14A, and the surface of the substrate G is subjected to scrub-cleaning while applying a cleaning liquid to the substrate G (in a step S3). Subsequently, the substrate G is rinsed with pure water and is then dried (in a step S4).

Next, the first main arm mechanism 14A delivers the substrate G to the second main arm mechanism 14B by the unit 20. The second main arm mechanism 14B conveys the substrate G to the adhesion unit 24. In the adhesion unit 24, HMDS vapor is made act while heating the substrate G, thereby to make the surface of the substrate hydrophobic (in a step S5). Further, the substrate G is cooled to a target temperature by a cooling section COL3 by temperature control. The substrate G is conveyed to the unit 21 and a resist solution is coated to the substrate G (in a step S6). Subsequently, a resist film 9b is removed from the peripheral edge portion of the substrate G (in a step S7). Note that the inside of the unit 21 is kept exhausted during the steps S6 and S7.

Figure 11:
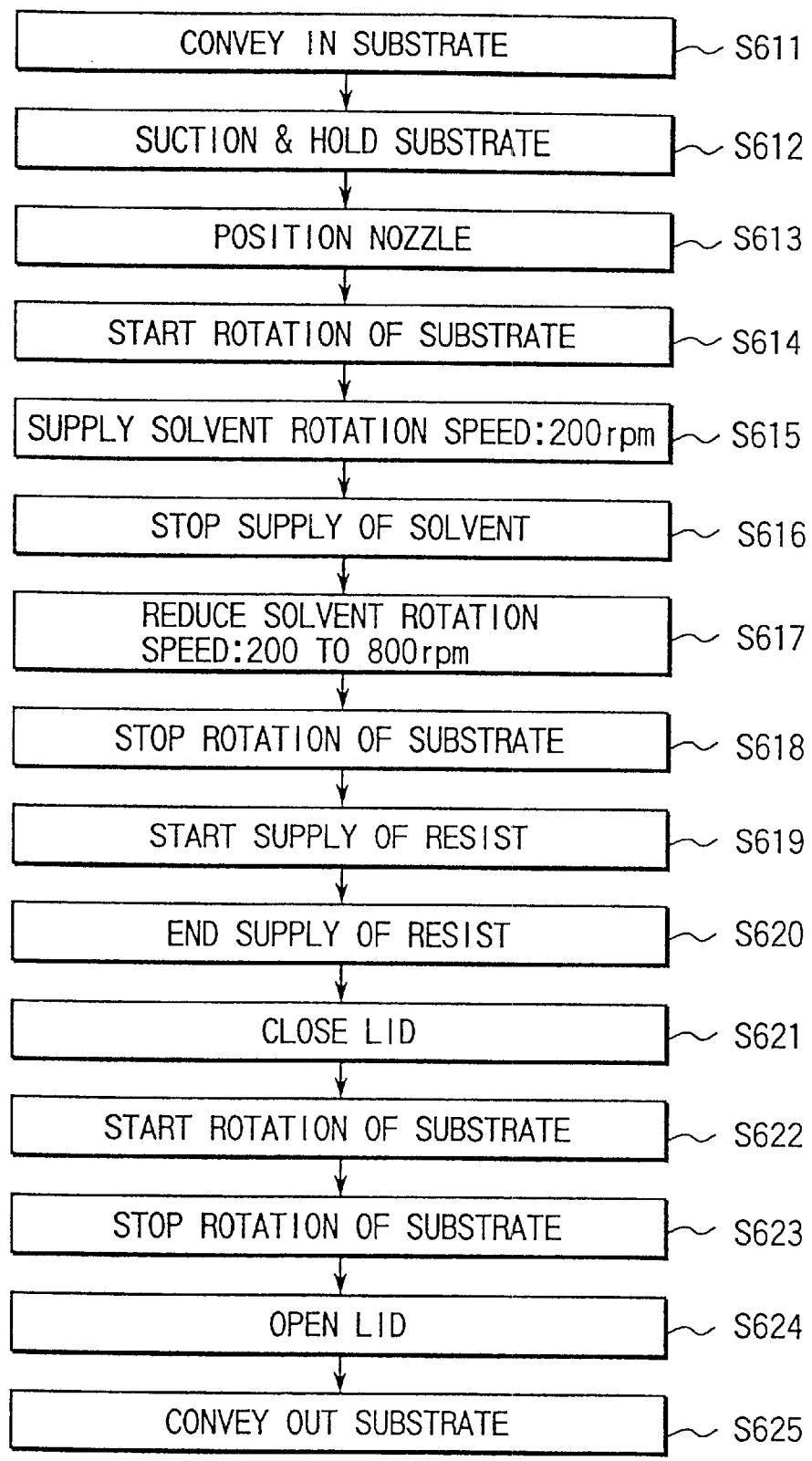
FIG. 11 is a flowchart showing a film forming method according to an embodiment of the present invention.
Figure 12A:
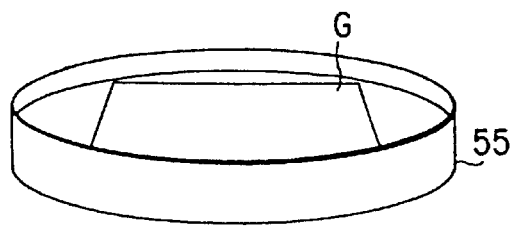
FIGS. 12A to 12G are perspective views for explaining the outline of the film forming method according to an embodiment of the present invention, respectively showing states of the LCD substrate and the film forming apparatus in steps.

The resist coating step S6 will be explained more specifically with reference to FIG. 11. When the second main arm mechanism 14B reaches the unit 21, a shutter (not shown) is opened and the lid 71 is detached from the cup 55 by the robot arm 75. The second main arm mechanism 14B moves forwards the holder 14b and conveys the substrate G into the resist coating section 22 of the unit 21 (in a step S611). The spin chuck 38 is elevated up and the substrate G is moved onto the spin chuck 38 from the holder 14b, and the substrate G is vacuum suctioned and maintained by the spin chuck 38 as shown in FIG. 12A (in a step S612). The holder 14b is moved back from the unit 21 and the shutter is closed.

The swing mechanism 105 swings the horizontal arm 106 and moves both the nozzles 91 and 92 to use positions from home positions. In this manner, the resist solution supply nozzle 92 is positioned just above the rotation center portion (or second portion) of the substrate G, and the solvent supply nozzle 91 is positioned just above the intermediate portion (or first portion) of the substrate G (in a step S613). The "rotation center portion (or second portion) of the substrate G" indicates a narrow region including the center point of the substrate G and the vicinity of the center point when the substrate G is rotated by the spin chuck 38. The "intermediate portion (or first portion) of the substrate G" indicates such a region which is deviated from the center point of the substrate G and is positioned in the middle between the center point of the substrate G and the peripheral edge thereof.

The temperature of thinner 8 in the flow path of the solvent supply nozzle 91 is controlled to a target temperature of 23° C.±1° C. The temperature of the resist solution 9 in the flow path of the resist solution supply nozzle 92 is controlled to the same target temperature as above.

Figure 12B:
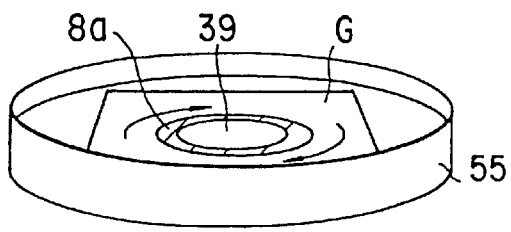
Figure 12C:
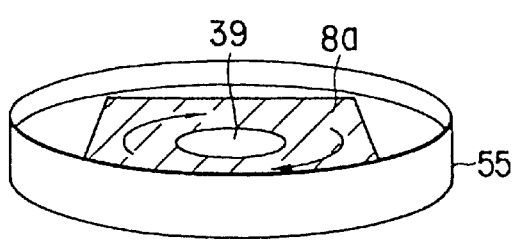

The motor 51 is started to start synchronous rotation of the substrate G and the cup 55 (in a step S614). While the substrate G is rotated at a first rotation speed of 200 rpm, the solvent 8 is supplied toward a first portion of the substrate G only for about two seconds, and then, a circular solvent application region 8*a* is formed as shown in FIG. 12B. Further, the solvent application region 8*a* spreads to the periphery (in a step S615).

Figure 13:
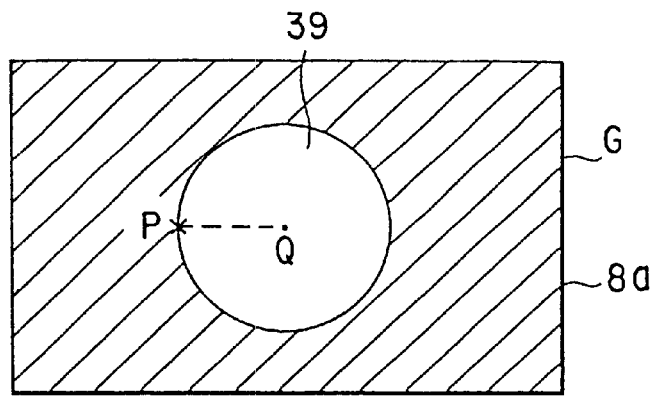
FIG. 13 is a schematic plan view showing a state where a solvent is supplied onto the LCD substrate from the solvent supply nozzle.

As shown in FIG. 13, the solvent 8 is supplied to a point P deviated from the rotation center point Q of the substrate G. For example, the supply point P is preferably the position which is located on an inner side to the outer peripheral edge portion of the spin chuck 38 in the plan view of FIG. 13. In the case where the point P is located on an outer side to the outer peripheral edge portion of the spin chuck 38, the solvent 8 collides with the edge portion of the substrate being in rotation, thus causing the scattering of the solvent. Conversely, in the case where the point P is located on an inner side to the outer peripheral edge portion of the spin chuck 38, the scattering of the solvent will not occur. Once the solvent 8 is supplied to the point P, the solvent 8 diffuses toward the outside of a circle having a radius PQ around the point Q situated as its center, and a solvent application region 8*a* hatched with oblique lines in FIG. 13 is formed. As a result of this, a non-application region 39 applied with no solvent 8 is formed at the center of the substrate G.

Supply of the solvent 8 from the nozzle 91 to the substrate G is stopped (in a step S616). Subsequently, the substrate G is rotated at a rotation speed of 200 to 800 rpm for three to five seconds to reduce the amount of solvent 8 existing on the substrate G (in a step S617). In the step S617, the rotation speed of the substrate G is preferably 600 rpm, for example, and the substrate G is rotated preferably for about three seconds at the rotation speed.

The drive of the motor 51 is stopped so that the synchronous rotation of the spin chuck 38 and the cup 55 is stopped, thereby to make the substrate G stand still (in a step S618).

Figure 12D:
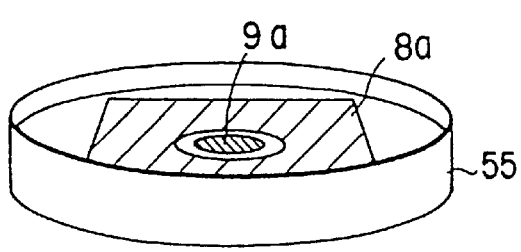
Figure 14:
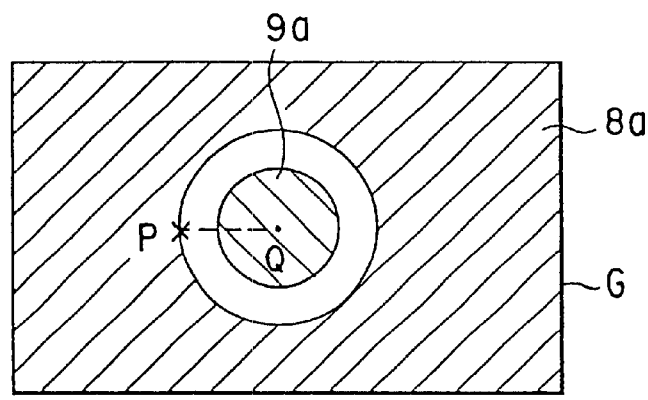
FIG. 14 is a schematic plan view showing a state where a resist solution is supplied onto the LCD substrate from the resist solution supply nozzle.

Next, supply of a resist solution 9 is started to the non-application region 39 (e.g., the rotation center portion of the substrate G; the second portion) from the nozzle 92 (in a step S619). As shown in FIGS. 12D and 14, the resist solution 9 is supplied to the rotation center point Q of the substrate G. In this time, the supply amount of the resist solution 9 is 14 cc and the supply period of the resist solution 9 is about three seconds. After supply of the resist solution 9 to the substrate G is completed (in a step S620), the nozzles 91 and 92 are moved back to home positions from use positions by the swing mechanism 105.

Figure 12E:
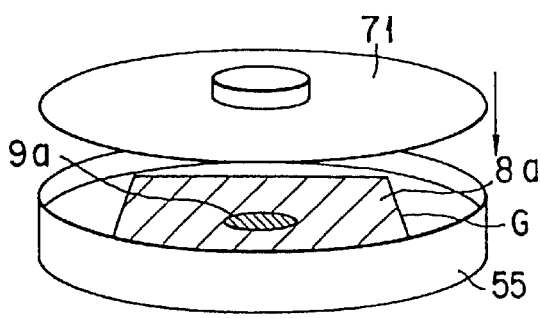
Figure 12F:
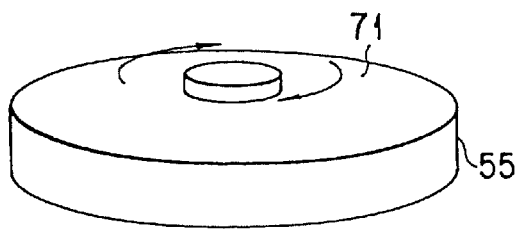

As shown in FIG. 12E, the lid 71 is covered over the cup 55 by the robot arm 75 and the upper opening 55*c* is closed by the lid 71, so that the peripheral atmosphere is of the substrate G is kept air-tight (in a step S621). Subsequently, as shown in FIG. 12F, the spin chuck 38 and the rotation cup 55 are rotated in synchronization with each other at a second rotation speed higher than the first rotation speed described before (in a step S622). In this manner, the resist solution 9 supplied onto the substrate G is diffused and the film thickness of the resist film 9*a* to be formed on the substrate G is adjusted. Note that the second rotation speed in the step S622 is preferably 600 to 800 rpm. Mist generated in the processing chamber 56 when rotating the substrate G flows into the drain cup 80 and is exhausted to the outside through the exhaust port 81. Therefore, mist is prevented from rising up and polluting the upper side of the rotation cup 55.

Figure 12G:
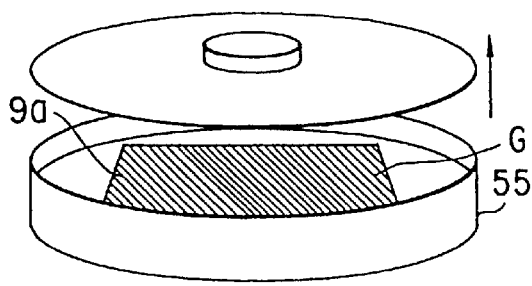

Rotation of the substrate G is stopped (in a step S623). By this series of steps S611 to S623, a resist film 9*a* aimed as a target is formed on the upper surface of the substrate G (in a step S6). As shown in FIG. 12G, the lid 71 is detached from the cup 55 by the robot arm 75 (in a step S624). The substrate G suctioned and held by the spin chuck 38 is released. The substrate G is grasped by a chuck portion of a convey mechanism (not shown), and is conveyed out of the resist coating section 22 to the peripheral edge resist remover section 23 (in a step S625).

In the peripheral edge resist remover section 23, the mount table is elevated up and the substrate G is transferred onto the mount table after the substrate G is conveyed into the section. The mount table is elevated down and the substrate G is positioned with respect to four nozzles 23*a*. Subsequently, the solvent 8 is discharge from the nozzles 23*a* while moving the nozzles 23*a* along the four edges of the substrate G, respectively. The resist film 9*b* is dissolved and removed from the peripheral edge portion of the substrate G (in a step S7).

Next, the second main arm mechanism 14B conveys the substrate G out of the unit 21 to the unit 26. The resist film 9*a* is subjected to pre-baking processing (in a step S8). Further, the substrate G is cooled in the cooling unit 27 and the substrate G is conveyed into the exposure device 7 through the interface section 6. The resist film 9*a* is subjected to pattern exposure by the exposure device 7 (in a step S9). Subsequently, the substrate G is conveyed to the development unit 30 and is subjected to development processing by applying a development solution to the resist film 9*a* (in a step S10). Further, the substrate G is rinsed with pure water (in a step S11) and is then dried (in a step S12). Further, the substrate thus processed is sequentially conveyed by the main arm mechanisms 14A, 14B, and 14C and is then contained into a cassette C2 of the loader/unloader section 2 by the first sub-conveyer arm 13 (in a step S13). Finally, substrates G together with the cassette C2 are conveyed out of the system 1 to a processing device of a next step.

According to the embodiment described above, when supplying the resist solution 9 to a substrate G, the substrate G stands still (or stops rotating) and the resist solution 9 is therefore prevented from scattering to the periphery, so that the generation amount of particles is extremely small.

In addition, since the resist solution 9 is supplied after supplying a solvent 8 to the substrate G, the resist solution 9 reaches to the corner portions of the periphery of the substrate G. Accordingly, a uniform resist film can be formed on the substrate G. Further, since the coating solution is not brought into contact with the solvent and is diffused while it is not diluted, a coating film can be made to have more uniform thickness. Further, since the resist solution 9 is supplied after the solvent 8 on the substrate G is spreaded and reduced, the amount of scattered resist solution can be reduced without reducing the adhesion between the resist solution 9 and the substrate G is not reduced more than in the case where the solvent 8 is not reduced.

Further, since scattering of the resist solution 9 is reduced, the resist solution 9 supplied onto the substrate G more efficiently contributes to formation of a resist film than in a conventional case, and therefore, the amount of resist solution 9 required for resist application processing can be saved.

In addition, the solvent 8 is supplied to a point P derived from the rotation center portion of the substrate G, and the center of the substrate G is not supplied with the solvent 8

(ref. FIGS. 13 and 14). Therefore, the consumption amount of the solvent 8 can be reduced by an amount saved by not supplying the solvent 8 to the rotation center portion of the substrate G.

After a resist film having a predetermined thickness is thus formed on a substrate G, rotation of the spin chuck 32 and the rotation cup 55 is stopped together, and the lid 71 closing the opening portion 55a of the rotation cup 55 is released. In this time, in the processing chamber 56 of the rotation cup 55, an air introduced from the air supply ports 72 is exhausted from the exhaust port 76, so that the pressure inside the processing chamber 56 is not decreased under a necessary negative pressure. Therefore, a large force is not necessary to release the lid 71. Therefore, the lid 71 can be released with ease.

The supply timings and the supply spots at which the solvent 8 and the resist solution 9 are supplied for a substrate G are not limited to those as described in the above embodiment. For example, the solvent 8 and the resist solution 9 may be simultaneously supplied to a substrate G. The processing time can be much more shortened by simultaneous supply of the solvent 8 and the resist solution 9, so that the throughput can be improved. Also, for example, the solvent 8 may be supplied to another spot than the point P. By supplying the solvent 8 to a plurality of spots, the solvent 8 can be thoroughly diffused to the corners of the substrate G. Therefore, the amount of the solvent consumed can be reduced.

In addition, after simultaneously supplying the solvent and the resist solution 9 to the substrate G, the substrate G is rotated. Therefore, the resist solution 9 can be uniformly diffused to the corner portions of the substrate G, so that the resist film has a uniform thickness.

Further, since the solvent 8 and the resist solution 9 are supplied to a substrate G which stands still, the amounts of solvent 8 and resist solution 9 scattered to the outside can be restricted. In addition, since the substrate G is rotated after the lid 71 is covered over the cup 55 to make an air-tight processing atmosphere, the resist solution 9 on the substrate G are not scattered to the outside or periphery of the cup 55, so that the periphery is prevented from being polluted.

In the above embodiment, it has been explained that the solvent 8 is supplied to a point P corresponding to the vicinity of the outer periphery of the spin chuck 32. However, the present invention is not limited to the embodiment. Specifically, if the rotation speed and the rotation period of the LCD substrate are changed in the step of reducing the solvent 8, the solvent 8 can be supplied to a position outside the point P. In this case, if the solvent 8 is supplied to a position inside the inscribed circle of the substrate G, it is possible to restrict loss of the solvent 8 supplied to the substrate G.

Figure 15:
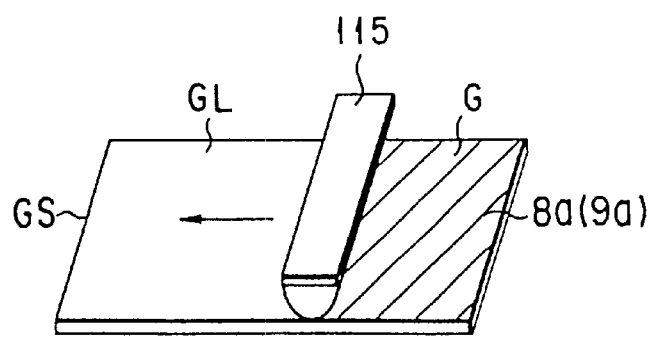
FIG. 15 is a perspective view showing the outline of another resist solution supply nozzle.

In addition, a linear type nozzle 115 shown in FIG. 15 can be used in place of the resist solution supply nozzle 92 described above.

Figure 16:
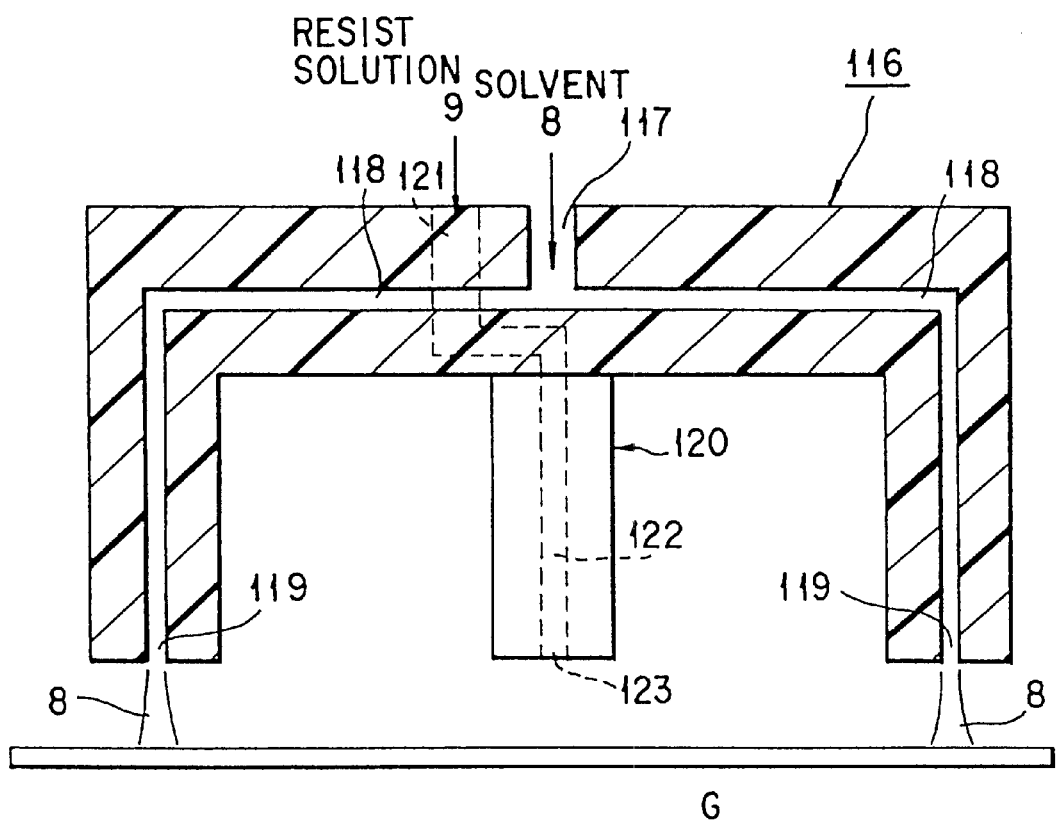
FIG. 16 is an enlarged cross-sectional view showing the outline of another solvent supply nozzle.
Figure 17:
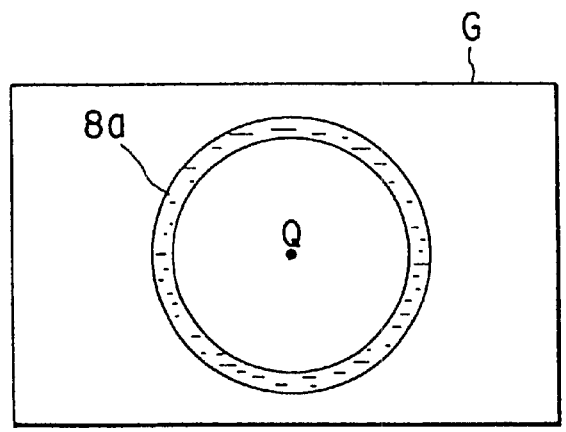
FIG. 17 is a schematic plan view showing a state where a solvent is supplied onto the LCD substrate by the another solvent supply nozzle.
Figure 18:
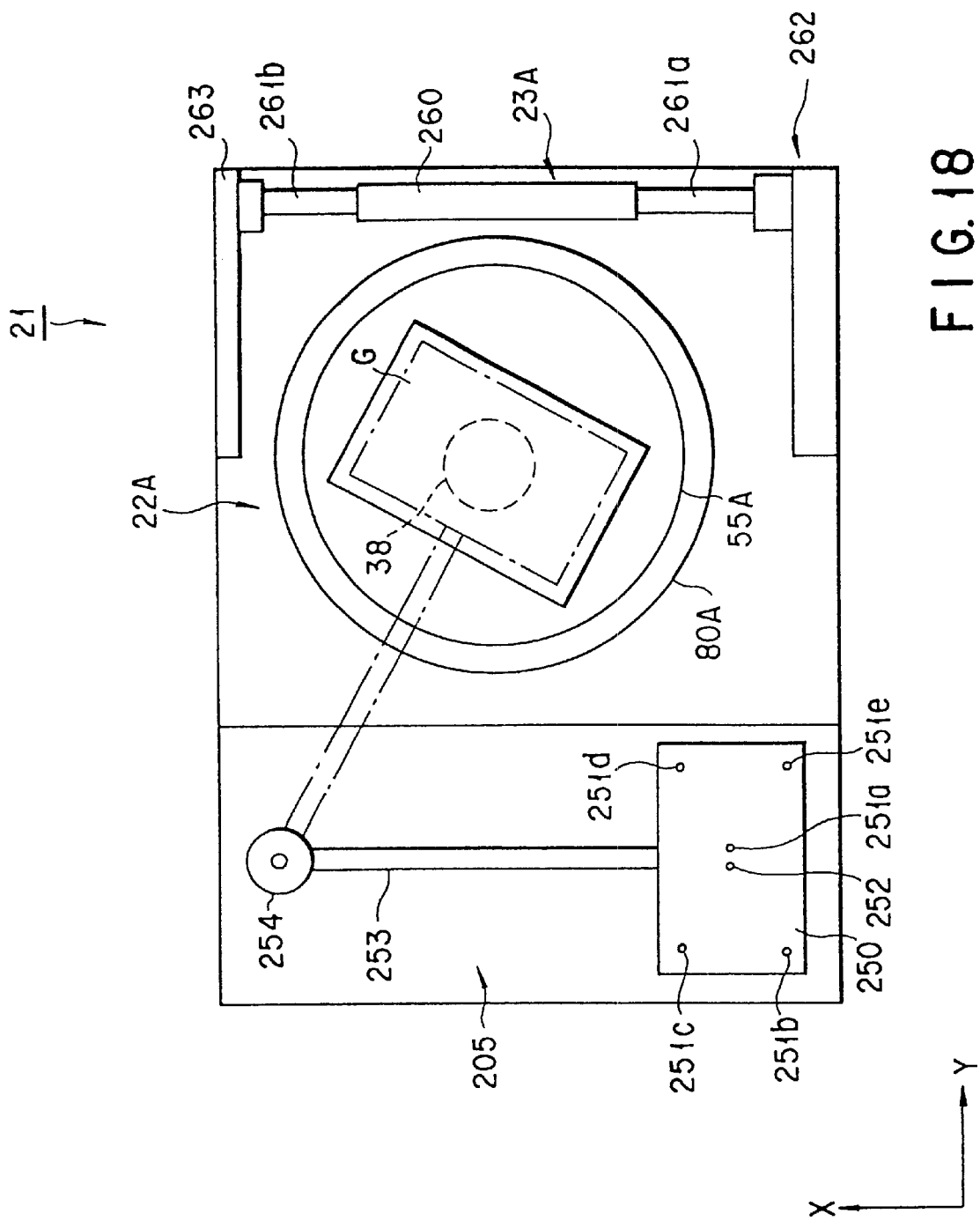
FIG. 18 is a plan view showing the outline of a film forming apparatus according to the embodiment of the present invention.

Although the above embodiment has been explained to a case of supplying the solvent 8 to the first portion of a substrate G from the supply nozzle 91, the present invention is not limited hitherto, but the solvent can be supplied to the substrate G using a different type of supply nozzle 116 as shown in FIG. 16. The liquid discharge port 119 of this type of supply nozzle 116 forms a circular slit. When a solvent 8 is discharge from the liquid discharge port 119 toward a substrate G, as shown in FIG. 17, a circular solvent application region 8a (which is the hatched portion in the figure) is formed on the substrate G around a center of the point Q.

Further, a nozzle 120 may be provided at the center of the lower surface of the nozzle 116 and a resist solution 9 is supplied to a flow path 122 from resist supply sources through a supply port 121 so that the resist solution 9 is discharge from the nozzle discharge port 123 to the rotation center point Q of the substrate G. In this case, it is possible to supply the solvent 8 and the resist solution 9 to the substrate G substantially at the same time, so that the throughput of processing can be improved much more. Alternatively, it is possible that the substrate is rotated at such a rotation speed that the coating solution would not scatter. With this manner, the distribution of the process liquid after the supply of the process liquid becomes even more uniform, thus improving the uniformity of the thickness of the film.

In addition, the rotation speed of the spin chuck 38 and the rotation speed of the rotation cup 55 may be changed by changing the sizes of the slave pulley 50a and the slave pulley 66b. Further, the present invention is not limited to LCD substrates but is applicable to a case of processing a semiconductor wafer having a large diameter.

According to the present invention, after a solvent is applied, a process liquid diffuses over the solvent. Therefore, the process liquid can be diffused over to the peripheral portion of a substrate and particularly to the corner portions thereof. As a result, it is possible to obtain a film having a uniform thickness. The technique of removing the solvent is not limited to the swinging out by the rotation of the substrate, but the same effect can be achieved by some other techniques including the drying by heat.

In addition, when supplying the process liquid onto the substrate, rotation of the substrate is stopped. It is therefore possible to restrict scattering of the process liquid. As a result, pollution of the outside of the substrate can be prevented. In addition, since a solvent is supplied to a portion deviated from the rotation center portion of the substrate, the solvent content in the process liquid can be reduced more than in a conventional apparatus.

Further, the coating solution is diffused while it is not diluted, and therefore a coating film having more uniform thickness can be obtained.

Further, since the process liquid is supplied after the solvent supplied onto a substrate is reduced, the scattering amount of the process liquid is reduced so that the yield of the process liquid is increased.

In addition, the process liquid is supplied to a substrate kept standing still, and the lid is closed when rotating the substrate to diffuse the process liquid. Therefore, the process liquid is prevented from scattering to and polluting the outside of the processing apparatus. As a result, decrease of the yield can be restricted.

Further, since the process liquid and the solvent thereof are simultaneously supplied to a substrate, the throughput can be improved much more than in the case where the process liquid and the solvent thereof are separately supplied to the substrate.

Next, a second embodiment of the present invention will be explained below with reference to FIGS. 18 to 33.

The resist coating mechanism 22A of the second embodiment has a nozzle assembly 205 comprising five solvent supply nozzles 251a, 251b, 251c, 251d, and 251e, and one resist supply nozzle 252. This kind of nozzle assembly 205 is capable of simultaneously supplying the solvent 8 to the four corners and the center of a substrate G.

A spin chuck 38 is provided in the substantial center of the resist coating mechanism 22A. An upper portion of the spin chuck 38 is formed in a disk-like shape and has a diameter smaller than shorter edges of the substrate G. The spin chuck 38 is substantially the same as that of the first embodiment, and comprises a vacuum suction mechanism, a rotation drive mechanism, and an elevation mechanism.

The rotation cup 55A is provided so as to surround the spin chuck 38. The rotation cup 55A has an opened cylindrical shape having a bottom and an upper opening 55c, and the opening 55c is covered with a lid 231. The lid 231 can be detached from the by a robot arm 242.

A rectification plate 232 is provided in the rotation cup 55A. The rectification plate 232 is connected with the lid 231 by a support shaft 243, faces the spin chuck 38, and is larger than the substrate G. An O-ring 39 is provided between the bottom surface of the rotation cup 55A and the lower surface of the spin chuck 38. When the spin chuck 38 elevates down, the lower surface of the spin chuck 38 is brought into contact with the O-ring 39, and the inside of the rotation cup 55A is kept air-tight.

A drain cup 80A is provided so as to surround the rotation cup 55A. The drain cup 80A is covered with a lid 241. The lid 241 is connected with the lid 231 through a support shaft 243. Specifically, the two lids 231 and 241 and the rectification plate 232 are formed to be integral with each other and can be detached together from the cups 55A and 80A.

Air holes 234a and 244a are respectively formed in the vicinities of the centers of the lids 231 and 241. An exhaust port 234b is formed in the peripheral edge side of the bottom surface of the rotation cup 55A. A plurality of drain ports 245a are provided in the peripheral edge side of the bottom surface of the drain cup 80A, and an exhaust port 245b is formed inside the drain ports 245a.

The spin chuck 38 is connected to a motor drive shaft 51a through belt mechanisms 50a, 52a, and 51b. In addition, the spin chuck 38 is supported by an elevation cylinder 42 through a shaft 43 such that the spin chuck 38 can be elevated up and down. The elevation cylinder 42 has such an elevation stroke extending that extends from a processing position of the substrate G where the upper surface of the spin chuck 38 is positioned in the rotation cup 55A to a transfer position of the substrate G where the upper surface of the spin chuck 38 is positioned above the upper end of the drain cup 80A. In addition, the suction hole (not shown) of the spin chuck 38 communicates with a vacuum suction device not shown through a hollow rotation shaft 43 and a vacuum seal portion 40.

The rotation cup 55A is equipped at the top portion of the rotation cylinder 61b by a connection cylinder 60, and the outer circumferences of the rotation cylinder 61b and the connection cylinder 60 are equipped with slave pulleys 50a and 66b having an equal diameter. Belts 37a and 37b are respectively wound to be bridged between the drive pulley 51b and the slave pulleys 50a and between the drive pulley 51b and the slave pulley 51b. The spin chuck 38 and the rotation cup 55A are rotated in synchronism with each other by driving of a common motor 51.

Figure 20:
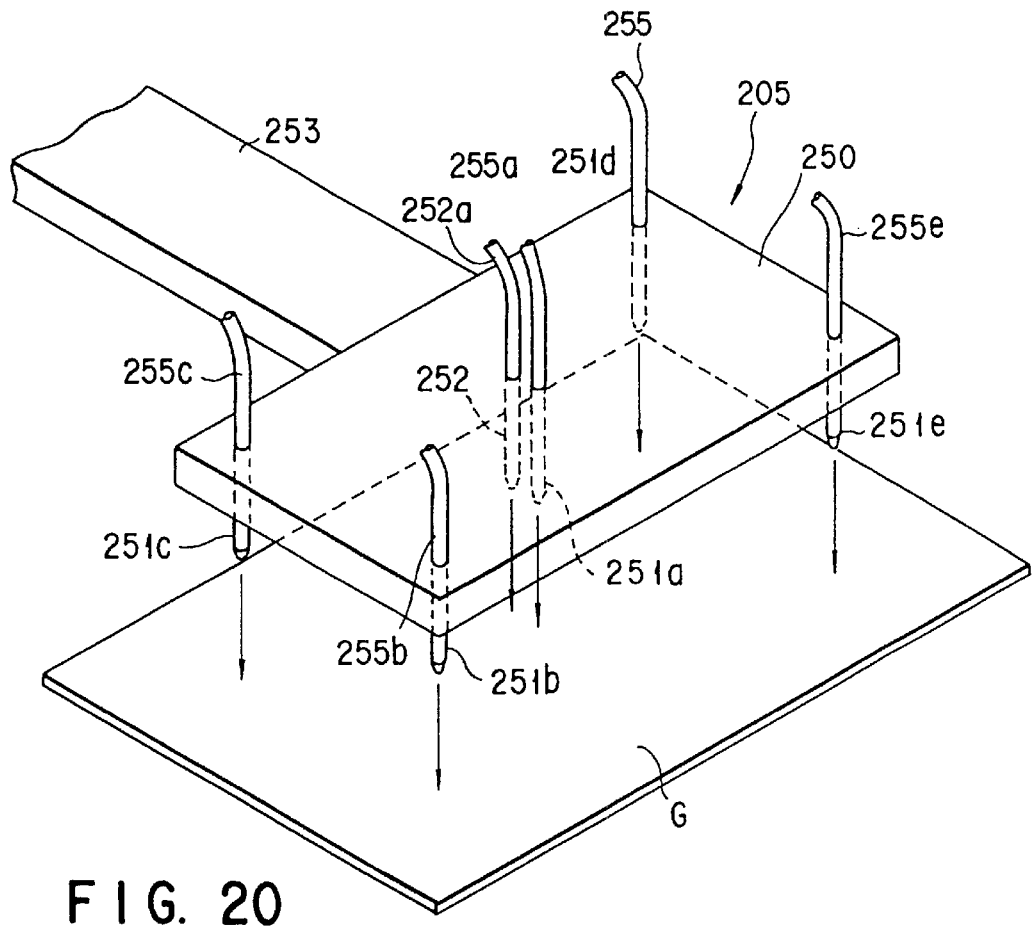
FIG. 20 is a perspective view showing a liquid supply portion of the film forming apparatus according to the embodiment.

A nozzle assembly 205 is provided at an end portion of the resist application mechanism 22A. As shown in FIG. 20, the nozzle assembly 205 comprises a rectangular block 250 for supporting five nozzles 251a, 251b, 251c, 251d, and 251e, and a nozzle 252 for supplying a solvent 8. The rectangular block 250 is equipped on the top end of a movable arm 253, and the movable arm 253 is supported such that the arm 253 can be swung around the Z-axis by a swing mechanism 254.

Figure 21:
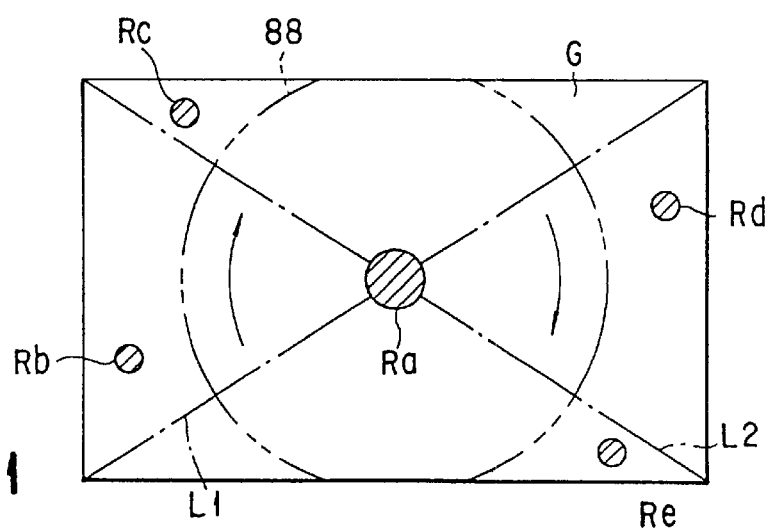
FIG. 21 is a schematic plan view showing the substrate supplied with a resist solution by the film forming apparatus according to the embodiment.

Next, supply of a liquid (e.g., a solvent or a resist solution) from the nozzles 251a, 251b, 251c, 251e, and 252 will be explained with reference to FIGS. 20 and 21.

The first nozzle 251a and the sixth nozzle 252 are arranged and disposed in the substantial center of the rectangular block 250. A resist solution 9 is supplied from the first nozzle 251a to a portion Ra in the rotation center portion of the substrate G. A solvent 8 is supplied from the sixth nozzle 252 to a portion Ra of the rotation center portion of the substrate G. The solvent 8 supplied from the sixth nozzle 252 is a so-called pre-wet liquid for previously moistening the substrate G before supplying the resist solution 9. The second, third, fourth, and fifth nozzles 251b, 251c, 251d, and 251e are respectively provided to four corners of the rectangular block 250. As shown in FIG. 21, resist solutions 9 are respectively supplied from the nozzles 251b, 251c, 251d, and 251e to portions Rb, Rc, Rd, and Re of four corner regions the substrate G (which are portions where the supply amount of the resist solution 9 diffused from the portion Ra at the rotation center portion is insufficient). The portions Rb, Rc, Rd, and Re are positioned outside a concentric circle 88 indicated by a two-dot chain line in FIG. 21, at positions slightly deviated in the rotation direction of the substrate G (e.g., in the clockwise direction indicated by an arrow in the figure) from the diagonal lines L1 and L2 indicated by one-dot chain line in the figure. Note that the concentric circle 88 indicates a range which the resist solution 9 diffused from the portion Ra at the rotate center portion can reach. It is important that the diameter of the concentric circle 88 is slightly larger than the length of the short edges of the substrate G.

Figure 26:
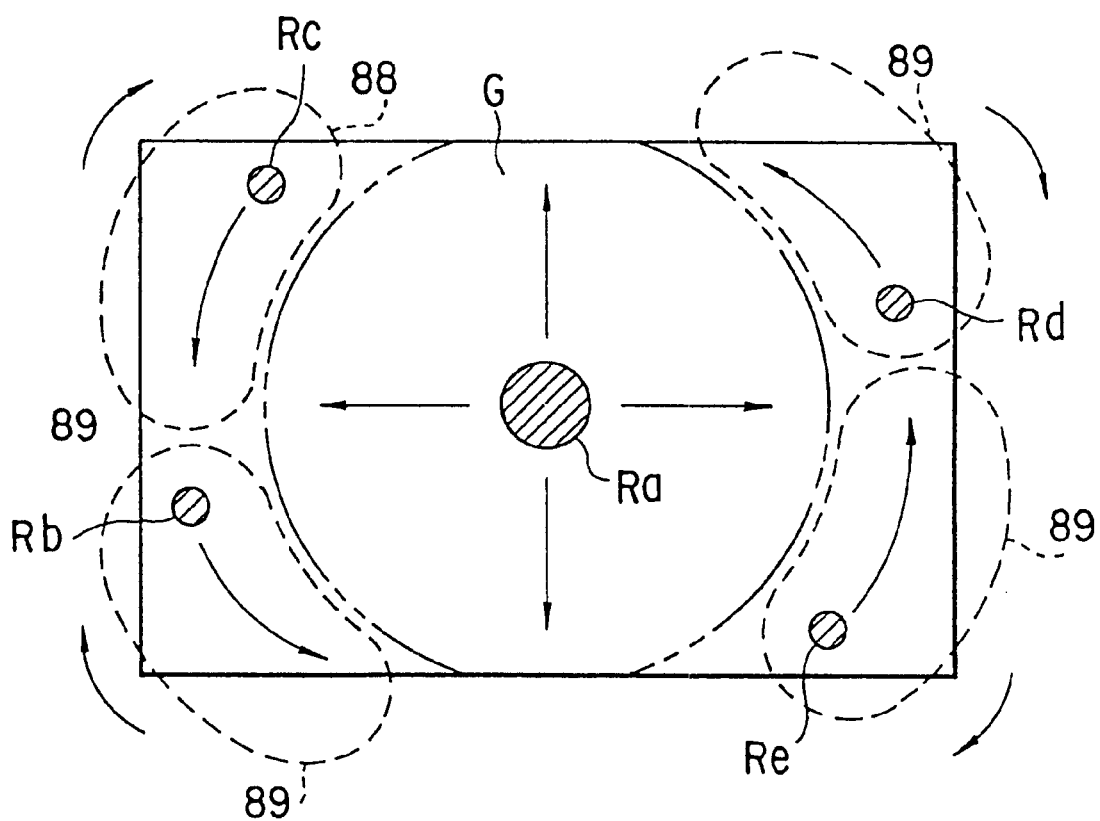
FIG. 26 is a schematic plan view for explaining the state where a resist solution supplied onto the substrate diffuses over the surface of the substrate.

If a resist solution 9 is supplied to the portions Rb, Rc, Rd, and Re, the resist solution 9 is diffused from the portions Rb, Rc, Rd, and Re as shown in FIG. 26 when the substrate G is rotated, and the resist solution 9 is charged to each of the four corner regions of the substrate G. As a result, the resist solution 9 thoroughly spreads over the entire surface of the substrate G, and a resist film 9a having a uniform film thickness is formed.

Figure 19:
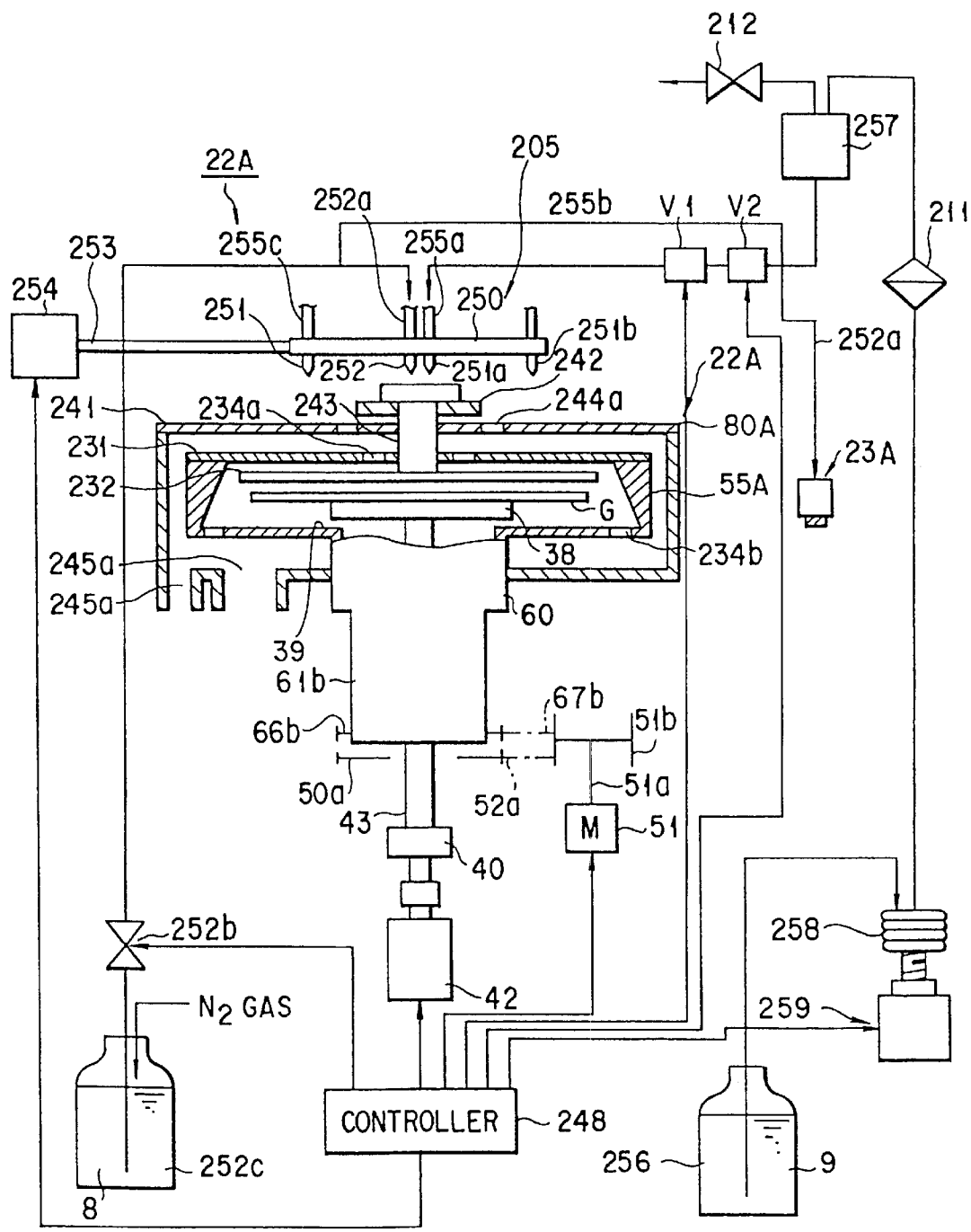
FIG. 19 is a cross-sectional block diagram showing the outline of the film forming apparatus according to the embodiment of the present invention.

As shown in FIGS. 19 and 20, the first to fifth nozzles 251a, 251b, 251c, 251d, and 251e communicate with a resist solution tank 256 through supply tubes 255a to 255e, respectively. Each of the supply tubes 255a to 255e is provided with a suck-back valve V1, an air operation valve V2, a scrub remover mechanism 257, a filter 211, and a bellows pump 258.

The bellows pump 258 can be expanded and driven by a drive section 259. A controller 248 controls the drive period and the drive speed of the bellows pump 258 and opening/closing operation of the air operation valve V2, thereby to adjust the supply amount of the resist solution 9 from the nozzles 251a to 251e. In place of using the bellows pump 258, a pressure gas of $N_2$ may be introduced into the tank 256 thereby to convey the resist solution 9. In this case, the controller 248 adjust the supply amount of the resist solution 9 by controlling the pressure of the $N_2$ gas.

The sixth nozzle 252 communicates with a solvent tank 252c through the supply tube 252a and the opening/closing valve 252b. The controller 248 adjust the supply amount of the resist solution 9 by controlling the pressure of the pressure gas of $N_2$ introduced into the solvent tank 252c.

Further, a peripheral edge film remover section 23A is provided outside the drain cup 80A. The peripheral edge film remover section 23A comprises an edge remover 260 as shown in FIGS. 22 and 23. Arms 261a and 261b are equipped at both ends of the edge remover 260. The arm 261a is moved in the horizontal direction by the drive mechanism 262, thereby moving the arm 261b in the horizontal direction along a guide rail 263. Thus, the edge remover 260 comes close to or apart from the outer peripheral edges of the substrate G.

The edge remover 260 has a length slightly larger than the long edges of the substrate G, and end plates 264 and 264b are equipped at both ends of the edge remover 260. A slit-like solvent discharge portion 266 is provided on the upper surface of the edge remover 260, and the solvent 8 is sprayed to the portion slightly deviated inwards from the end edges of the upper surface of the substrate G, by the discharge portion 266.

A header 265 made of quartz is provided at an upper portion of the edge remover 260. The header 265 communicates with the solvent tank 252c through a flexible tube 252d, and the inside of the tank 252c is filled with the solvent 8. Further, a slit 265a is formed in the bottom surface of the header 265 so as to correspond to the solvent discharge portion 266.

A slit-like solvent discharge portion 267 is provide at the lower surface side of the edge remover 260 and sprays the solvent 8 to portions in the vicinity of the end edges of the substrate G, thereby to remove an unnecessary resist film 9b. A plurality of suction tubes 268 forming suction/exhaust paths are connected, at intervals, to the side surface of the edge remover 260. Dissolved materials of the resist and an excessive solvent are suctioned and exhausted through a suction pump not shown.

In the next, operation of the above apparatus will be explained with reference to FIGS. 24A to 24D and FIGS. 25A to 25C.

Figure 24A:
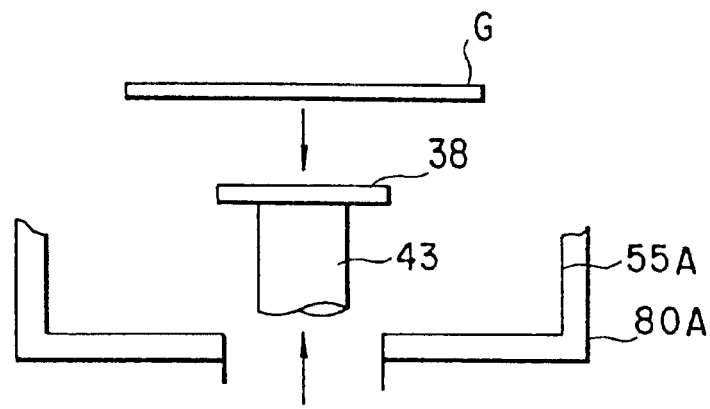
FIGS. 24A to 24D are internal schematic perspective views for explaining operation of the film forming apparatus.

As shown in FIG. 24A, with the lids 231 and 241 detached form the cups 55A and 80A, the spin chuck 38 is elevated up, and the substrate G is transferred to the spin chuck 38 from the holder 14b of the main arm mechanism and is suctioned and held thereon.

Figure 24B:
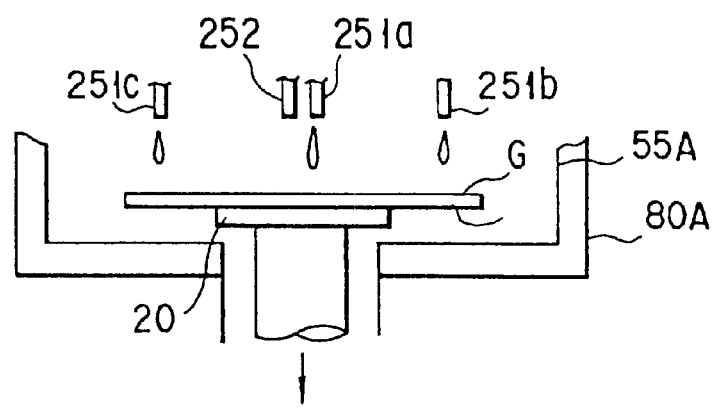

As shown in FIG. 24B, the spin chuck 38 is elevated down and a solvent 8 is supplied from the sixth nozzle 252 to the portion Ra at the rotation center portion of the substrate G. For example, a mixture of PGME and PGMEA is used as the solvent 8. Subsequently, a resist solution 9 is supplied from the first nozzle 251a to the portion Ra at the rotation center portion of the substrate G. Further, resist solutions 9 are supplied from the second to fifth nozzles 251b to 251e to the portions Rb, Rc, Rd, and Re near the four corners of the substrate G. In this case, the supply amount of the resist solution 9 from the first nozzle 251a is greater than the supply amount of the resist solutions 9 from the second to fifth nozzles 251b to 251e. Once supply of the resist solution 9 to the substrate W is completed, the rectangular block 250 is moved back to a home position shown in FIG. 25B from a use position shown in FIG. 25A. Further, the peripheral edge resist remover mechanism 23A is moved form a home position to a use position.

Figure 24C:
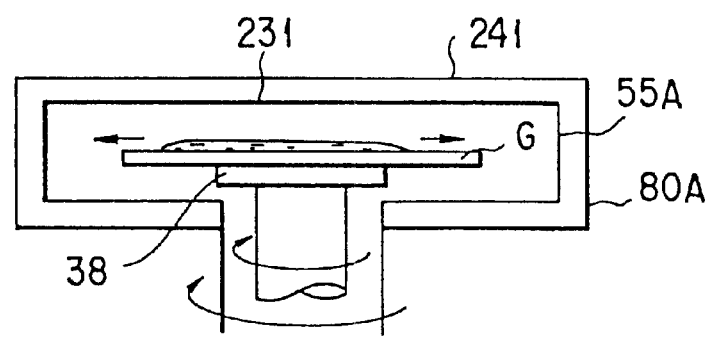

As shown in FIG. 24C, the lids 231 and 241 are attached to the cups 55A and 80A, and the spin chuck 38 and the rotation cup 55A are synchronously rotated at a rotation speed of 200 to 800 rpm. Further, the spin chuck 38 and the rotation cup 55A are synchronously rotated at a rotation speed of 500 to 1500 rpm. In this manner, as shown in FIG. 26, a resist solution 9 is diffused from the portion Ra at the rotation center portion to the concentric circle region 88 surrounded by a two-dot chain line, and also, resist solutions 9 are respectively diffused from the portions Rb, Rc, Rd, and Re in the vicinity of the four corners the four corner to regions 89 each surrounded by a two-dot chain line. Further, the substrate G is rotated at a rotation speed of 1000 to 3000 rpm. As a result, the resist solution 9 completely spreads over the entire surface of the substrate G, and the film thickness of the resist film is adjusted uniformly. Thus, the resist solution 9 is supplied over the entire surface of the substrate G, and a resist film 9a having a uniform thickness is formed.

In the resist application step described above, an air introduced from an air hole 234a is exhausted from an exhaust hole 234b, and as a result, mist of scattered resist solution 9 is exhausted together with a air, from the rotation cup 55A. In addition, an air which has entered into the drain cup 80A from an air hole 244a is exhausted from an exhaust hole 245b by rotation of the rotation cup 55A. In this manner, mist of the resist solution 9 which has flowed into the drain cup 80A during rotation of the rotation cup 55A is exhausted from the exhaust hole 245b.

Figure 24D:
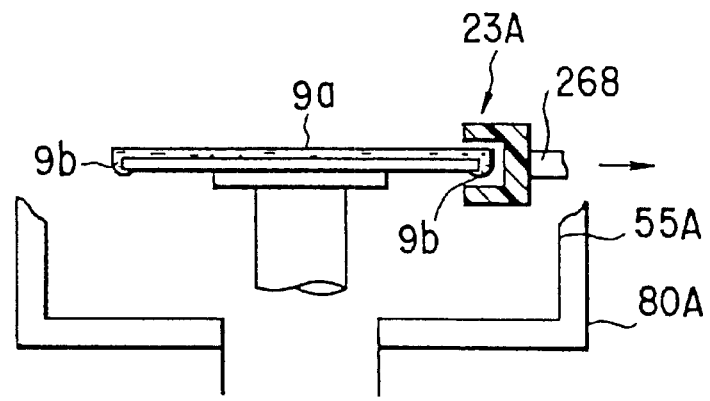
Figure 25A:
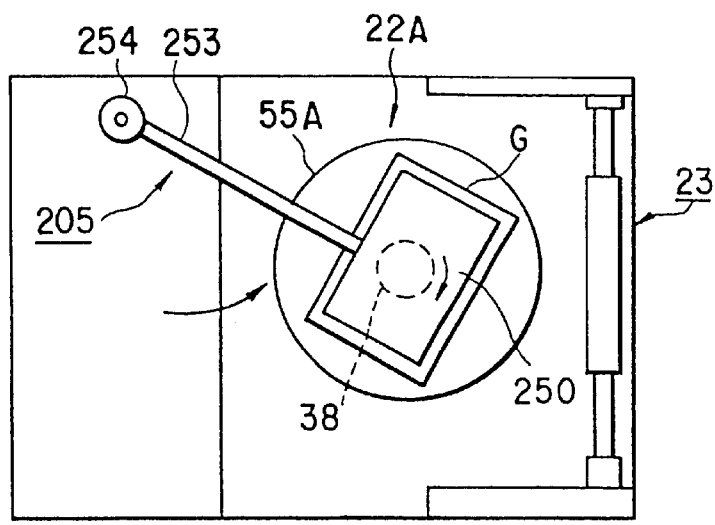
FIGS. 25A to 25C are schematic plan views for explaining the operation of the film forming apparatus.
Figure 25B:
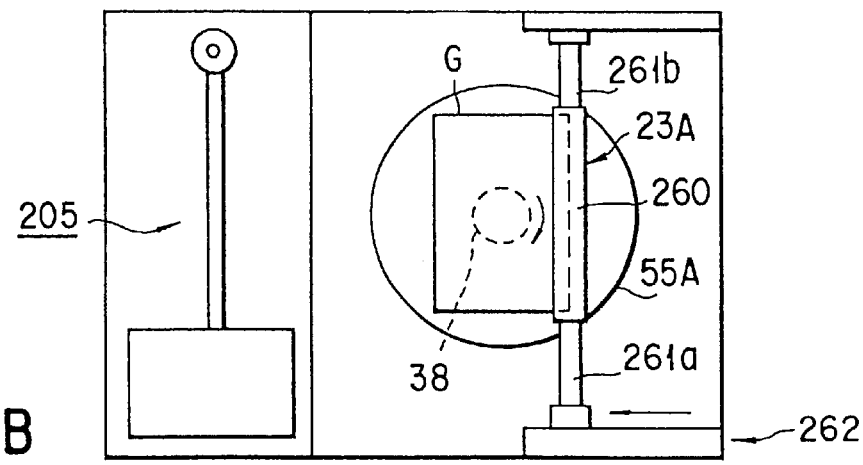
Figure 25C:
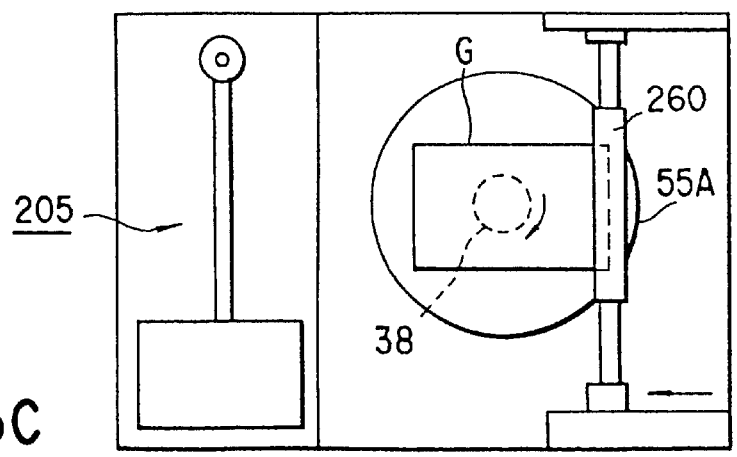

As shown in FIGS. 24D and 25B, the lids 231 and 241 are detached from the cups 55A and 80A, the peripheral edge resist remover mechanism 23A is positioned with respect to the long edges of the substrate G and a solvent 8 is sprayed to the peripheral portion of the substrate G to remove an unnecessary resist film 9b from the substrate G. Further, as shown in FIG. 25C, the orientation of the substrate G is changed by 90°, and the peripheral edge resist remover mechanism 23A is positioned with respect to the short edges of the substrate G. The solvent 8 is also sprayed to the peripheral edge portion of the substrate G to remove an unnecessary resist film 9b from the substrate G.

In the apparatus according to the embodiment described above, the waste amount of the resist solution 9 is reduced so that the total consumption amount of the resist solution 9 can be greatly reduced. Specifically, by supplying resist solutions 9 to the portions Rb to Re at the four corners of the substrate G, insufficient supply of the resist solution from the portion Ra at the rotation center portion can be supplemented. Therefore, in case of attaining a throughput substantially equal to that of a conventional apparatus, the consumption amount of a resist solution can be saved more than in a conventional apparatus.

Further, in the apparatus according to the above embodiment, since resist application processing and peripheral edge resist removal processing are carried out on one same spin chuck, the apparatus itself is downsized more than in a conventional apparatus.

The position or timing of the supply of the resist solution is not limited to the above-described examples, but it is possible that the resist solution is supplied at a plurality of sections of the substrate at the same time. In this manner, the through-put can be improved.

Also, as shown in FIG. 27A, while supplying the resist solution 9 to the portion Rf at the rotation center portion of the substrate G, the resist solution 9 may be supplied to two portions Rg and Rg positioned point-symmetrically around the portion Rf as a center.

In addition, as shown in FIG. 27B, while supplying the resist solution 9 to the portion Ri at the rotation center portion of the substrate G, the resist solution 9 may be supplied to four portions Rj, Rk, Rl, and Rm positioned point-symmetrically around the portion Rf as a center, on the diagonal lines L1 and L2.

Also, as shown in FIG. 27C, while supplying the resist solution 9 to the portion Ri at the rotation center portion of the substrate G, the resist solution 9 may be supplied to band-like portions Ro, Rp, Rq, and Rr extending radially around the portion Rn as a center. Note that the number of band-like portions is not limited to four but may be one, two, three, five, or six. In the example shown in FIG. 27C, it is possible to use slit nozzles having discharge ports respectively having shapes corresponding to the portions Ro, Rp, Rq, and Rr. Also, the resist solution 9 may be supplied to the band-like portions Ro, Rp, Rq, and Rr by moving each of four nozzles (not shown) form the rotation center portion toward the peripheral portions.

Further, as shown in FIG. 27D, while supplying the resist solution 9 to the portion Rs at the rotation center portion of the substrate G, the resist solution 9 may be supplied to a circular portion Rt on the concentric circle around the portion Rs as a center. The resist solution 9 at the circular portion Rt supplements the resist solution diffused from the portion Rs, and as a result, the resist solution 9 spreads to the four corner regions of the substrate G. In the example shown in FIG. 27D, it is possible to use a slit nozzle having a discharge port having a shape corresponding to the circular portion Rt (ref. FIG. 16).

Further, when the amount of the resist solution supplied to each of these sections is adjusted independently depending upon the site, the amount of the resist consumed can be even more reduced. In the case of a supply system having a plurality of supply openings, such as the nozzle assembly 205, a mechanism (not shown) for adjusting the amount of the resist solution supplied, may be provided for each supply opening.

Figure 28:
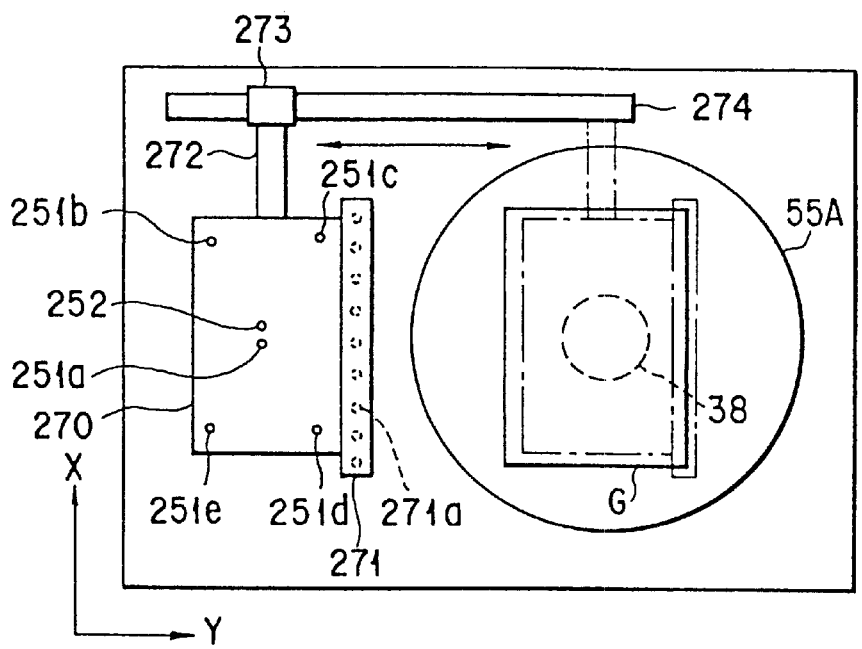
FIG. 28 is a plan view showing a film forming apparatus according to the embodiment of the present invention.
Figure 29:
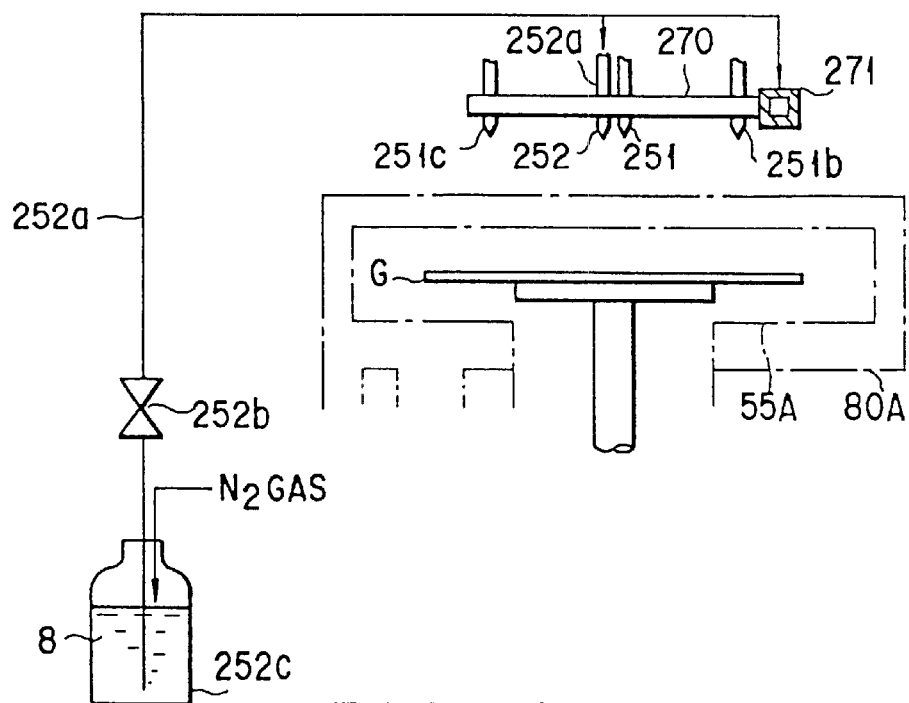
FIG. 29 is a circuit diagram showing a film remover mechanism included in the embodiment of the present invention.
Figure 30:
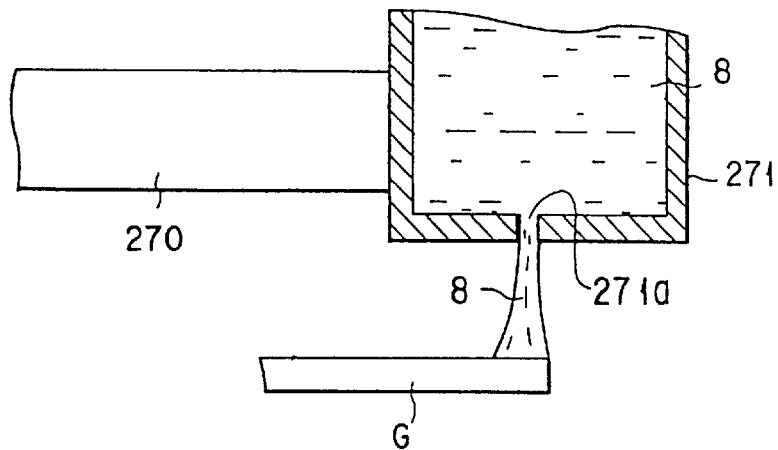
FIG. 30 is an enlarged partial cross-sectional view showing the film remover mechanism.

Next, another embodiment will be explained with reference to FIGS. 28 to 30.

In the apparatus according to the present embodiment, a process liquid supply section (or nozzle assembly) 270 and a peripheral edge resist remover section (or edge remover) 271 are moved by a common drive mechanism 273. The edge remover 271 is equipped at an edge of the nozzle assembly 270 having a rectangular shape. A movable arm 272 is equipped at another edge of the nozzle assembly 270. The drive mechanism 273 comprises the movable arm 272 for supporting the nozzle assembly 270 and the edge remover 271, a ball screw mechanism 274 for guiding and moving the movable arm 272 in the Y-axis direction, and an elevation mechanism (not shown) for elevating up the movable arm 272. The nozzle assembly 270 and the edge remover 271 are on standby at a home position outside the cup 55A when not used, and are moved above the cup 55A when used.

The edge remover 271 is slightly longer than the long edges of the substrate G. and a number of discharge ports 271a communicating with the header are opened at a lower portion the edge remover 271. The header of the edge remover 271 is supplied with a solvent 8 from a solvent supply source, and the inside of the header is always filled with the solvent 8.

The nozzle assembly 270 is substantially the same as the nozzle assembly 250 described before. However, a solvent nozzle 252 and an edge remover 271 of the nozzle assembly 270 use, in common, a part of a supply circuit. Specifically, a tube 252a communicates with the solvent nozzle 252 and also communicates with a header (not shown) of the edge remover 271 through a branch (not shown).

Operation of the above apparatus will be explained below.

In a resist application step, the nozzle assembly 270 is positioned above a substrate G, a resist solution 9 is supplied to appropriate portions of the substrate G, and the substrate G is spun. Meanwhile, in a peripheral edge resist remove step, the lids 231 and 241 are detached from the cups 55A and 80A, the edge remover 271 is positioned along an edge of the substrate G, and a solvent 8 is sprayed toward the edge portion of the substrate G. As shown in FIG. 30, a solvent 8 is sprayed from the edge remover 271 to the peripheral edge portion of the substrate G by a water head pressure (or a pressure of a pressure gas). By thus spraying the solvent 8, the resist film 9a is dissolved and dissolved materials thereof flow into the drain cup provided below. After the resist film 9a is thus removed from the long edges of the substrate G, the orientation of the substrate G is changed by 90°, and further, the resist film 9a is removed from the short edges of the substrate G by the edge remover 271.

In the embodiment described above, since the drive mechanism 273 is used in common by the nozzle assembly 270 and the edge remover 271, the apparatus itself can further be downsized. In addition, since the edge remover 271 is equipped in the nozzle assembly 270, a part of a supply circuit of the solvent 8 can be used in common, and the supply circuit of the solvent can be shortened as a whole.

Figure 31:
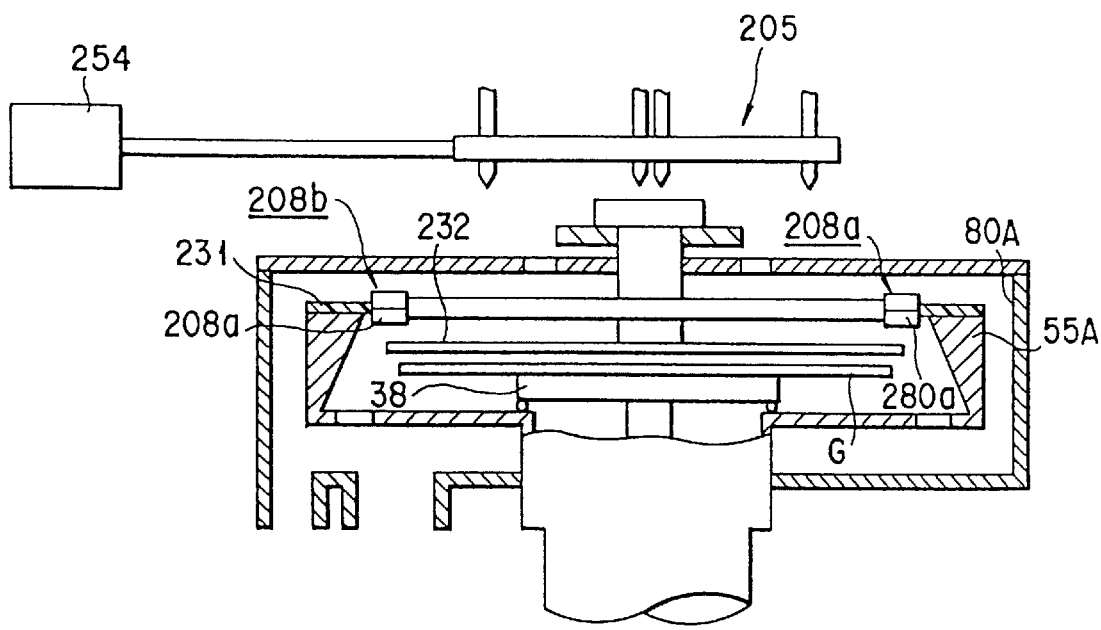
FIG. 31 is a schematic cross-sectional view showing a film forming apparatus according to further another embodiment.

In the next, another embodiment will be explained with reference to FIGS. 31 to 33.

In the apparatus according to the embodiment, an edge remover 208 (including 208a to 208d) is equipped on the lid 231 of the rotation cup 55A. As shown in FIG. 32, the edge remover 208 comprises a pair of slit portions 208a and 208c which are shorter than long edges of a rectification plate 232, and a pair of slit portions 208b and 208d which are shorter than short edges of the rectification plate 232. Inner end sides of the slit portions 208a to 208d are seated on the peripheral edges of a holding base 281, and outer end sides thereof are seated on the lid 231 of the rotation cup 55A.

As shown in FIG. 33, each of the slit portions 208a to 208d comprises a plate-like base 280 provided above an edge portion of the rectification plate 232. End plates 280a are provided at both ends of the base 280. A slit-like discharge portion 282 for spraying a solvent to an end edge of the upper surface of the rectification plate 232 projects inwards, penetrating through the base 280, and extends in the lengthwise direction of the base 280. A head 283 for storing a solvent 8 is provided above the base 280. The solvent discharge port may be a narrow hole in place of a slit.

Solvent supply paths 284a to 284d are formed inside the holding base 281 to supply the solvent 8 to the heads 283, respectively. The solvent supply paths 284a to 284d communicate with a solvent supply tube 285. The other end of the solvent supply tube 285 is connected to a solvent supply tube 252a. An air hole not shown corresponding to an air hole 234a is formed in the holding base 281.

Next, operation of the apparatus described above will be explained below.

The film remover section 208 functions as a part of the lid 231, and the rotation cup 55A and the lid 231 rotate integrally. When removing a resist film 9a from an edge portion of a substrate G, the inside of the rotation cup 55A is kept air-tight and a solvent 8 is sprayed from the solvent discharge portions 282 to the vicinities of the end edges of the surface of the rectification plate 232 substantially over the entire periphery of the rectification plate.

In this manner, as shown in FIG. 33, the direction of the flow of the solvent 8 is changed by the end edges of the rectification plate 232 so that the solvent flows inwards from the lower portion of the rectification plate 232. Thus, the solvent 8 is sprayed to the edge portion of the substrate G. The resist film 9a is dissolved by the spraying force of the solvent 8, and dissolved materials thereof are drained to the drain cup below.

In the embodiment described above, since a movement mechanism is used in common by the edge remover 208 and the lid 231, the apparatus itself can be downsized. In addition, after application processing of the resist solution 9 is carried out, processing of removing the resist film can be sequentially be carried out with a substrate G enclosed in the rotation cup 3. Therefore, it is possible to shorten the time required for prosecuting the processing from the application processing of the resist solution 9 to the remove processing of the resist film.

In addition, since the lid 231 and the rotation cup 55A are rotated synchronously, positions of the slit portions 208a to 208d cannot be shifted with respect to the rectification plate 232 during processing if only the slit portions 208a to 208d are positioned so as to correspond to the edges of the rectification plate 232 (or the substrate G). If the positions are previously adjusted, it is advantageous that remove processing of the resist film 9a can be performed successively without positioning after carrying out application processing of the resist solution 9.

Next, a third embodiment of the present invention will be explained with reference to FIGS. 34 to 43.

Figure 34:
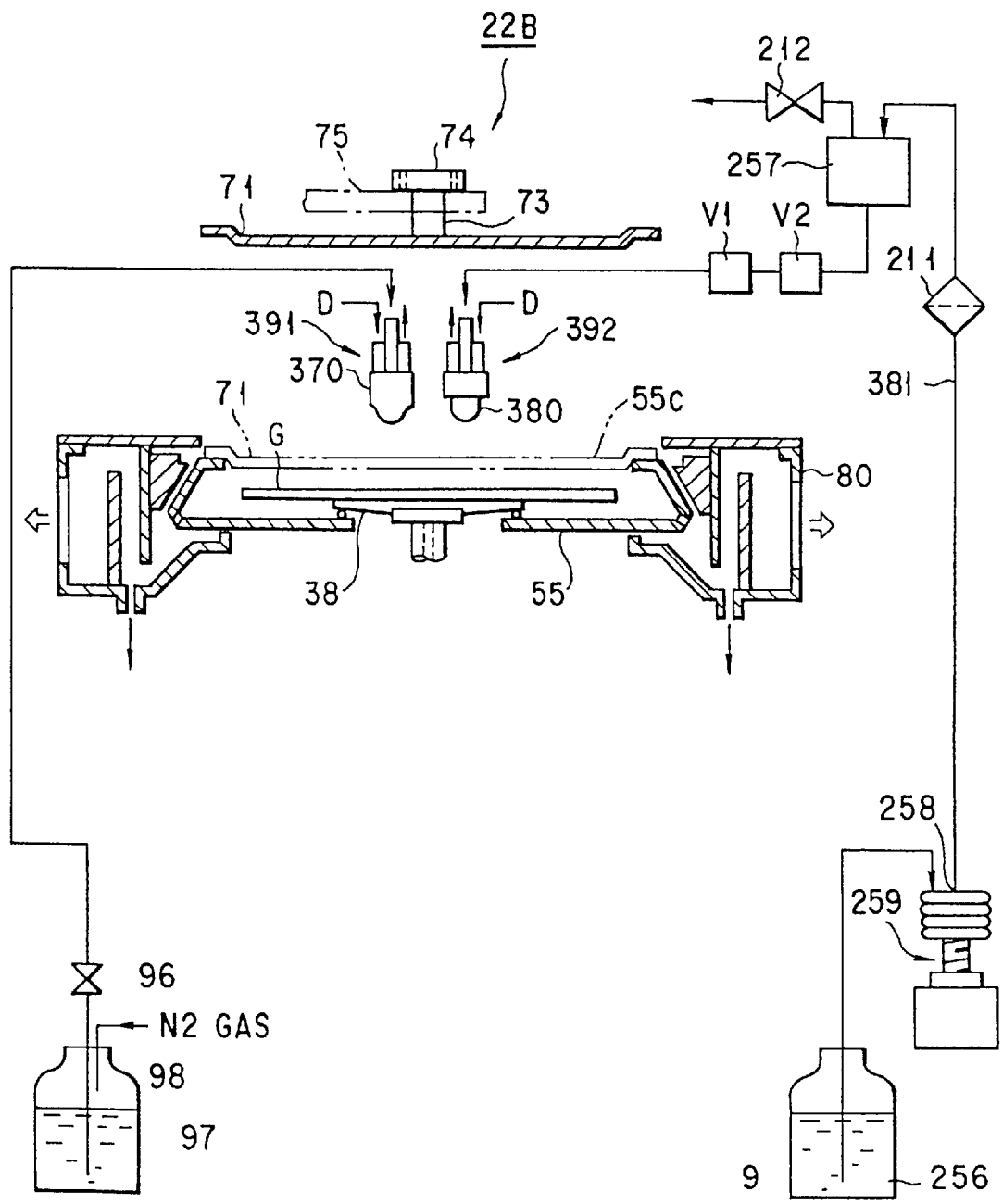
FIG. 34 is a cross-sectional block diagram showing the outline of an apparatus used in a film forming method according to another embodiment of the present invention.

As shown in FIG. 34, an application unit 22B comprises a spin chuck 38, a rotation cup 55, a lid 71, a robot arm 75, a drain cup 80, a solvent supply nozzle 370, and a resist solution supply nozzle 380.

Each of supply paths of the nozzles 370 and 380 is provided with a temperature control mechanism 391, and there is provided a temperature control mechanism 91 for circulating and supplying a solvent 8 and a resist solution 9 at a target temperature (e.g., 23° C.).

Figure 35:
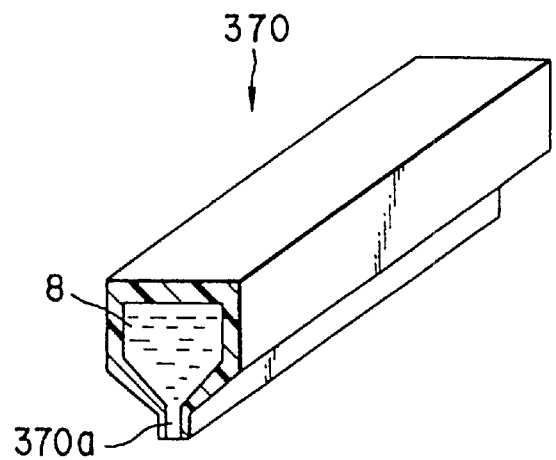
FIG. 35 is a partial cross-sectional perspective view showing a solvent supply nozzle used for coating a film.

The solvent supply nozzle 370 has a slit-like liquid discharge port 370 as shown in FIG. 35. The solvent supply nozzle 370 communicates with a solvent tank 97 through a circuit having an opening/closing valve 96. As shown in FIG. 34, a pressure of $N_2$ gas is supplied into the solvent tank 97 thereby to supply the solvent 8 to the nozzle 370 from the tank 97.

Figure 36:
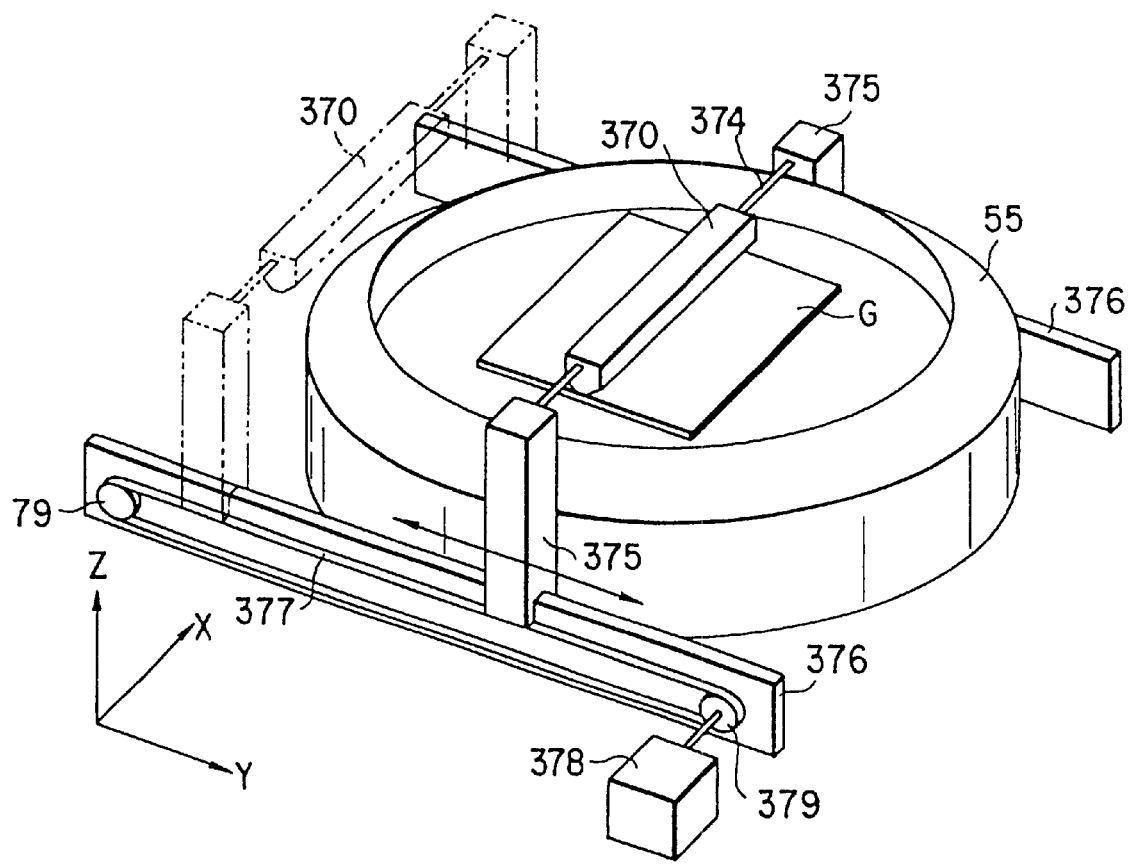
FIG. 36 is a perspective view showing the outline of a movement mechanism for moving the solvent supply nozzle.
Figure 39:
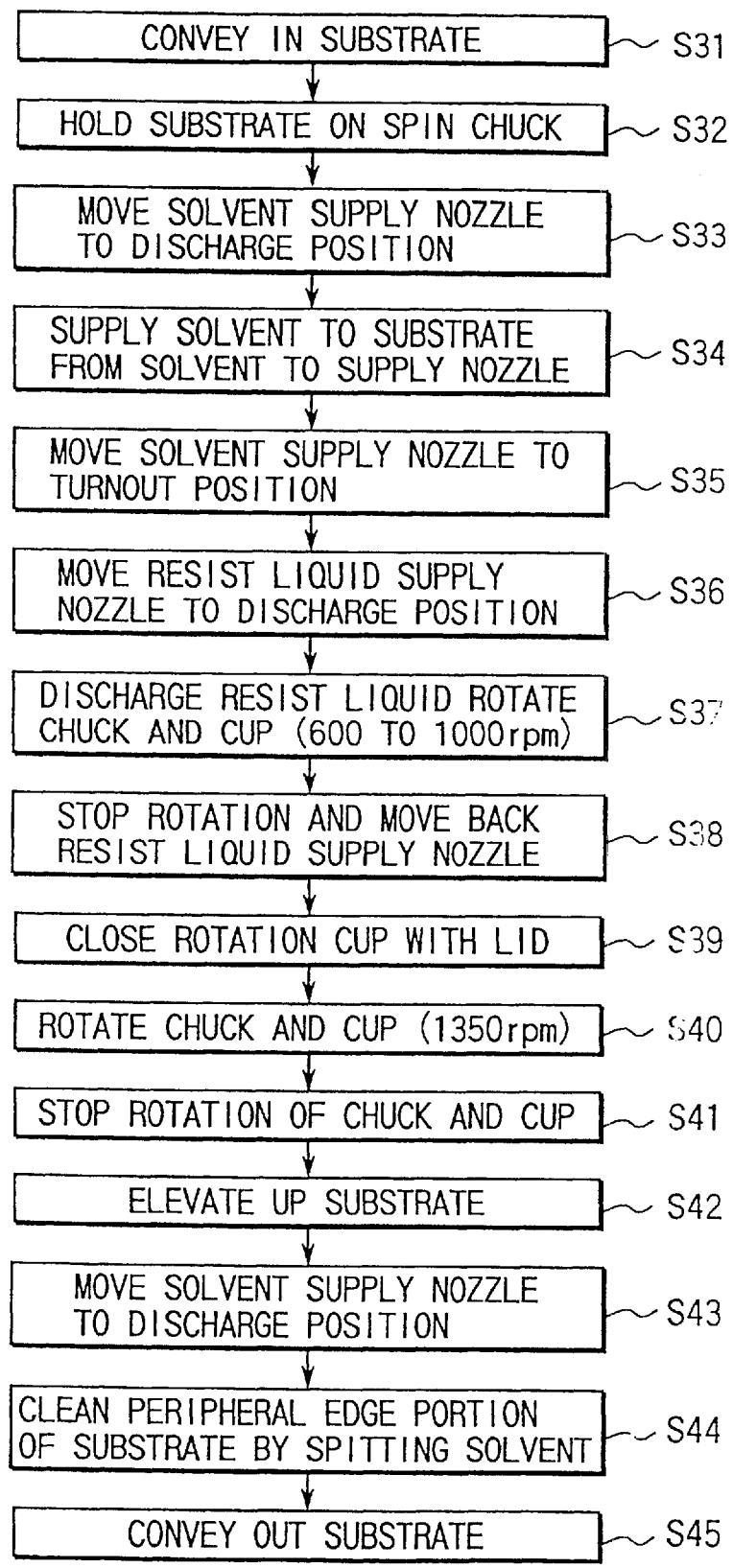
FIG. 39 is a flowchart showing a film forming method according to the embodiment of the present invention.

As shown in FIG. 36, the solvent supply nozzle 370 is equipped on a pair of support members 375 by a shaft 374, and the paired support members 375 are provided so as to sandwich the rotation cup 55 therebetween. A pair of guide members for respectively guiding the support members 375 are provided outside the rotation cup 55. A pair of pulleys 379 are respectively provided outside the guide members 376, and belts 377 are wound around the pulleys 379. The support members 375 are attached to the belts 377, and one of the pulleys 379 is installed on a drive shaft of a motor 378. Therefore, the pair of support members 375 are moved in the Y-axis direction by rotation drive of the motor 378, respectively guided by the guide rails 376, and the solvent supply nozzle 370 is moved accordingly. Further, the solvent supply nozzle 370 is movable between a discharge position at any position above a substrate G and a turnout position indicated by a two-dot chain line and situated apart from the substrate G. The length of the nozzle 370 is slightly larger than the long edges of the substrate G.

As shown in FIG. 37, a receive member 395 can be attached to a lower portion of the solvent supply nozzle 370. The receive member 395 comprises a dish-like body 395a provided below the nozzle 370, a support member 396 extending upwards in the vertical direction from the body, and a drain port 398 provided in the body. Attachment and detachment of the receive member 395 with respect t the solvent supply nozzle 370 are performed by a lock mechanism 392. The lock mechanism 392 includes a lock member 394 and a support pin 397. The lock member 394 is provided on a shaft 393 projecting form both side surfaces in the lengthwise direction of the solvent nozzle 370 such that the lock member 394 can be rotated between a lock position and a release position. The support pin 397 is provided to be capable of projecting into the support member 396 of the receive member 395 and can be inserted into a hole of the lock member 94. The receive member is locked by rotating the lock member 394 to the lock position thereby making the support pin 397 project and be inserted into the hole of the lock member 394, so that the receive member 395 is rendered movable integrally with the solvent supply nozzle 370. In case of releasing the lock, the support pin 397 is moved back and the lock member 394 is rotated to the release position. Note that the drain port 398 is connected with a tube 399 and a solvent pooled in the receive member 395 is drained to a collection portion not shown through the tube 399.

The resist solution supply nozzle 380 communicates with the resist solution tank 256 through a tube 381. The tube 381 is provided with a suck-back valve V1, an air operation valve V2, a scrub remover mechanism 257, a filter 211, and a bellows pump 258. By the bellows pump 258, it is possible to realize control which achieves a smaller supply amount than in a conventional apparatus.

As shown in FIG. 38, the resist supply nozzle 380 is supported on a support member 403 and can be moved between a home position and a use position by a movement mechanism 400. The movement mechanism 400 includes a drive mechanism (not shown), a rotation shaft 402 for transmitting rotation torque from the drive mechanism, and a movable member 401 equipped at an upper portion of the rotation shaft 402 and rotated together with the rotation shaft 402. A support member 403 is fixed to the movable member 401.

Next, explanation will be made of a case in which a resist film is formed on a substrate G and a resist film is removed from the peripheral edge portion of the substrate G, with reference to PIG. 39.

At first, the lid 71 is detached from the rotation cup 55 to release the upper opening 55c. A substrate G is conveyed into the apparatus 22B by the second main arm mechanism 14B (in a step S31). The substrate G is transferred from the holder of the main arm mechanism 14B to the spin chuck 38 and is suctioned and held by vacuum by the spin chuck (in a step S32).

The nozzle 370 is moved from a home position to a use position (in a step S33). With rotation of the substrate G stopped, for example, 26.7 cc of mixture of PGME and PGMEA is supplied as a solvent 8 of a process liquid, onto the surface of the substrate from the liquid discharge port 370a while scanning the substrate from an end portion to the other end portion, and pre-wet processing is thus carried out (in a step S34). Due to this processing, a resist solution 9 to be thereafter supplied can be diffused with ease, so that the use amount of the resist solution 9 can be reduced. After supply of the solvent, the substrate G may be rotated at a low speed of about 100 to 600 rpm. Also, in this state, the lock mechanism 392 is released and the receive member 395 is positioned at a turnout position.

Next, the nozzle 370 is moved back to the turnout position (in a step S35). The support member 403 is moved in the Y-axis direction by the movement mechanism 400, and the nozzle 380 is moved to a use position from a home position (in a step S36). Further, while rotating the spin chuck 38 and the rotation cup 55, for example, at a speed of 600 to 1000 rpm as a first rotation speed, 10 cc of resist solution 9 is discharge from the nozzle 380 to the center of a solvent film 8a formed on the substrate (in a step S37). In this state, supply of the resist solution is carried out before an applied solvent 8 is dried. Thus, the resist solution can be diffused over the entire surface of the substrate by rotating the substrate G at a relatively low speed, so that the use amount of the resist solution 9 can be reduced much more.

After discharging the resist solution, rotation of the spin chuck 38 and the rotation cup 55 is stopped and the nozzle 380 is moved back to the home position (in a step S38). Further, the lid 71 is mounted on the rotation cup 55 by the robot arm 75, and the opening portion 55c is closed by the lid 71 (in a step S39).

In this state, the spin chuck 38 and the rotation cup 55 are rotated for fifteen seconds, for example, at 1350 rpm as a much higher second rotation speed than the first rotation speed, to adjust the film thickness of the resist film 9a (in a step S40). By thus rotating the substrate G in a closed condition, a much more uniform film can be obtained.

Figure 40:
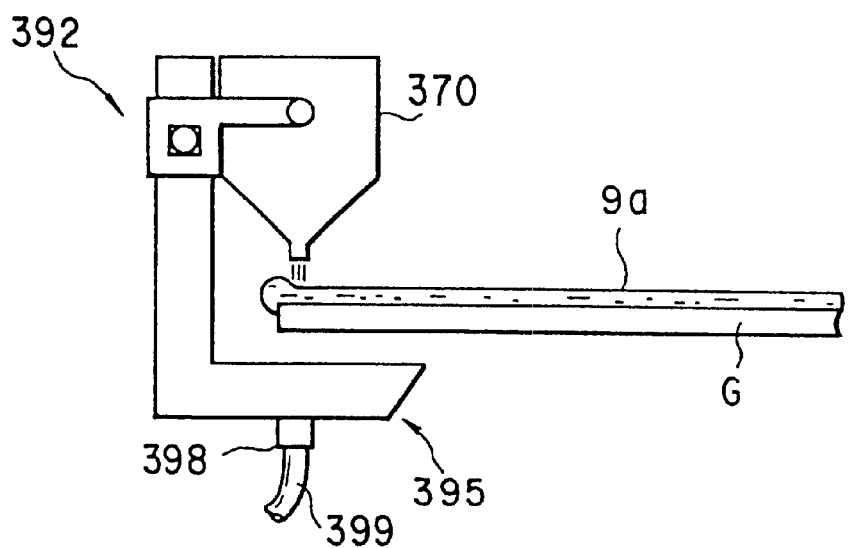
FIG. 40 is a view schematically showing a state where the peripheral edge portion of a substrate is cleaned by the solvent supply nozzle having the receiver member in the film processing unit.

After the step is completed, rotation of the spin chuck 38 and the rotation cup 55 is stopped (in a step S41), and the spin chuck 38 is elevated up (in a step S42). Further, the nozzle 370 is moved again to the discharge position above the substrate (in a step S43). In this case, the receive member 395 is locked by the lock mechanism 392, and the nozzle 370 is moved together with the receive member 395 so that the discharge port 370a comes to a position corresponding to the peripheral edge portion of the substrate G, as shown in FIG. 40. The substrate G is clamped between the nozzle 370 and the receive member 395. Further, a solvent 8 is supplied to the peripheral edge portion of the substrate G from the liquid discharge port 370a of the nozzle 370, and a resist film 9a is removed from the peripheral edge portion, thus collecting the solvent and the dissolved resist from the receive member 395 (in a step S44).

Upon completion of cleaning of the peripheral edge portion of an edge of the substrate G, the spin chuck 38 is rotated by 90°, and removal of the peripheral resist is similarly performed on a next edge of the substrate G. This process is repeated four times so that the resist film 9a is removed from the peripheral edge portions of all the edges of the substrate G.

After a series of processing for application processing is completed as described above, the lid 71 is moved to a standby position by the robot arm 75. The substrate G is conveyed out of the unit 22B and is conveyed to a heating unit 26 in a next step (in a step S45).

Thus, in the present embodiment, the amount of the resist solution consumed can be reduced by pre-wetting, and cleaning of peripheral edge portions of the substrate G can be realized by the nozzle 370 used for pre-wetting the solvent 8. Therefore, any additional equipment is not necessary to clean materials sticking to the peripheral edge portion of the substrate, and it is possible to avoid enlargement of the size of equipment. In addition, since a nozzle which moves along a peripheral edge of a substrate is not required, the problem of the position accuracy of the nozzle is overcome.

With respect to a rectangular LCD substrate G, a nozzle 370 having a slit-like liquid discharge port 370a is used and peripheral edge portions at the edges of the substrate G is cleaned while rotating the substrate G. Therefore, an edge of a substrate G can be cleaned by discharging a solvent for one time, and the peripheral edge portions of the substrate can be cleaned by only the rotation of the substrate G without moving the solvent supply nozzle 70, so that a very high efficiency is achieved. Further, when cleaning is performed, the spin chuck 38 is elevated up thereby to perform cleaning processing with the substrate G raised and without having a mutual interference between the nozzle 370 and the cup 55. It is therefore possible to facilitate cleaning of the peripheral edge portions of the substrate. Furthermore, since the receive member 395 is positioned below the substrate G when cleaning a peripheral edge portion of a substrate, the solvent used for cleaning the substrate can be rapidly collected so that harmful influences from the solvent can be restricted.

Figure 41:
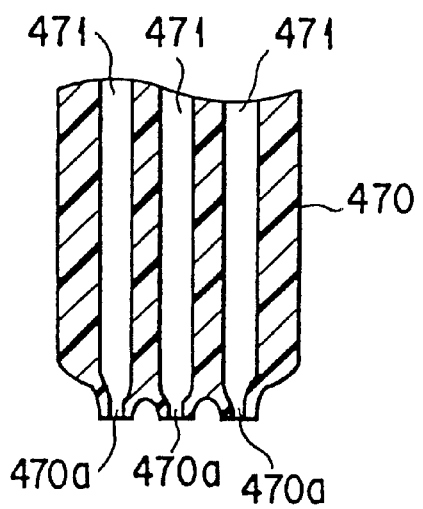
FIG. 41 is a cross-sectional view showing a modification of the solvent supply nozzle.

In addition, as shown in FIG. 41, it is possible to use a solvent supply nozzle 470 having a plurality of independent liquid flow lines 171 and a plurality of slit-like liquid discharge pots 470a corresponding to the plurality of liquid flow lines 471. In this case, the flow rate of each of the liquid flow lines 471 is controlled independently so that the cleaning ability can be increased with respect to the peripheral edge portions of the substrate.

Figure 42:
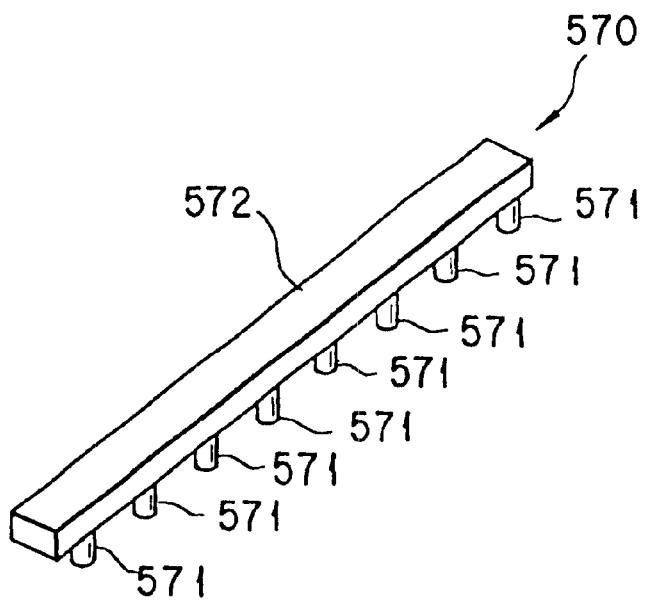
FIG. 42 is a perspective view showing another modification of the solvent supply nozzle.

As shown in FIG. 42, it is possible to use a nozzle 570 having a long body 570a and a plurality of discharge ports 571 provided at a lower portion of the body, so that a solvent 8 is discharge like a shower.

Figure 43:
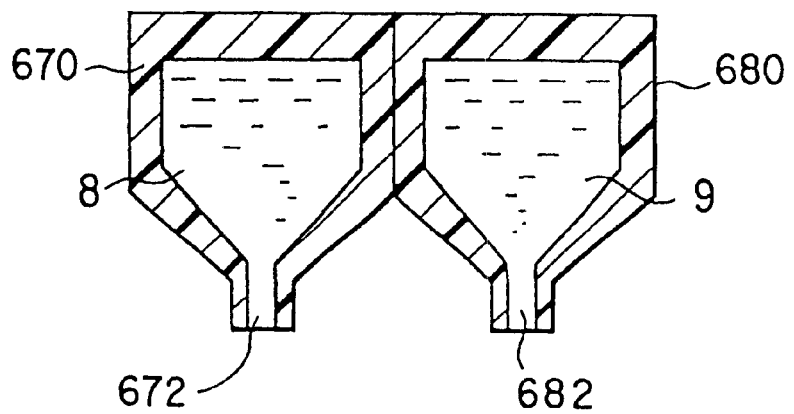
FIG. 43 is a cross-sectional view showing the solvent supply nozzle formed to be integral with the resist solution supply nozzle.

Further, the resist supply nozzle is not limited to the embodiments described above but may be a nozzle which vaporizes and supplies a resist solution or a slit nozzle. If a slit nozzle is used, it is possible to use a solvent supply nozzle 670 integrated with a resist supply nozzle 680, as shown in FIG. 43.

In the embodiments described above, a processing vessel and a substrate are rotated together. However, only the substrate may be rotated. Although the above embodiments have been explained to a case where a resist solution is used as a process liquid, the present invention is applicable to another kind of process liquid.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming apparatus comprising;
 a spin chuck that holds and rotates a rectangular substrate about a rotation center portion;
 a cup having an upper opening that allows the rectangular substrate to pass therethrough, the cup surrounding the rectangular substrate held by the spin chuck;
 a lid attachable to and detachable from the cup to close and open the upper opening thereof;
 a first circular/tubular nozzle having a single discharge port for supplying a resist solution to a first portion corresponding to the rotation center portion of the rectangular substrate held by the spin chuck;
 a plurality of second circular/tubular nozzles that supply the resist solution to a plurality of second portions of the rectangular substrate to which supply of the resist solution by centrifugal force is difficult, and supplement a shortage of the resist solution supplied by the first circular/tubular nozzle, each of said second nozzles having a single discharge port for supplying the resist solution to one of the plurality of second portions, and distances between the rotation center portion and each of the second portions being greater than a half of a shorter side of the rectangular substrate;

a rectangular nozzle holder that holds the first nozzle and the second nozzles such that distances between the first nozzle and each of the second nozzles are greater than half of the shorter side of the rectangular substrate and the plurality of second nozzles are respectively situated near corners of the rectangular nozzle holder;

a mechanism that positions the nozzle holder with respect to the spin chuck to position the first nozzle above the first portion of the rectangular substrate held by the spin chuck, and also to position the second nozzles respectively above the second portions of the rectangular substrate;

a controller that controls an amount of the resist solution supplied from the first nozzle to the first portion and an amount of the resist solution supplied from the second nozzles to each of the second portions, attaches the lid to the cup, and rotates the rectangular substrate with the spin chuck;

a resist solution tank;

a supply tube provided between the resist solution tank and the first and second nozzles;

a bellows pump provided in the supply tube and controlled by the controller for supplying the resist solution to the first and second nozzles; and an air operation valve provided in the supply tube and controlled by, the controller for passing or stopping the resist solution in the supply tube, wherein the resist solutions supplied by the first nozzle are diffused by centrifugal force, and the resist solutions are supplied to each of the second portions of the rectangular substrate, thereby combining the resist solution supplied by the first nozzle and the resist solution supplied by each of the second nozzles.

2. An apparatus according to claim 1, wherein the second portion is deviated from a diagonal of the rectangular substrate to a forward position in a rotation direction of the rectangular substrate.

3. An apparatus according to claim 1, wherein in the second portion is positioned on diagonal lines of the rectangular substrate.

4. An apparatus according to claim 1, further comprising a liquid amount controller that controls an amount of the resist solution supplied to the second portions from the discharge ports, for each of the discharge ports.

5. An apparatus according to claim 1, further comprising:

a third nozzle that supplies a solvent to the substrate before the resist solution is supplied to the substrate from the first and second nozzles;

a fourth nozzle that supplies the solvent to the substrate to remove a film from a peripheral edge portion of the substrate, after the resist solution is supplied from the first and second nozzles; and a common solvent supply that supplies the solvent to each of the third and fourth nozzles.

* * * * *

UNITED STATES PATENT AND TRADEMARK OFFICE
CERTIFICATE OF CORRECTION

PATENT NO. : 6,458,208 B1
DATED : October 1, 2002
INVENTOR(S) : Anai et al.

It is certified that error appears in the above-identified patent and that said Letters Patent is hereby corrected as shown below:

<u>Title page,</u>
Item [30], Foreign Application Priority Data, should read:
-- Aug. 19, 1997 (JP) ….. 9-238953
  Jan. 23, 1998 (JP) ….. 10-026726 --

Signed and Sealed this

Twelfth Day of August, 2003

JAMES E. ROGAN
*Director of the United States Patent and Trademark Office*